(12) United States Patent
Hayashi

(10) Patent No.: US 9,705,048 B2
(45) Date of Patent: Jul. 11, 2017

(54) LIGHT-EMITTING DEVICE AND METHOD FOR MANUFACTURING SAME

(75) Inventor: Masaki Hayashi, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 464 days.

(21) Appl. No.: 13/501,065

(22) PCT Filed: Oct. 8, 2010

(86) PCT No.: PCT/JP2010/067755
§ 371 (c)(1),
(2), (4) Date: Apr. 9, 2012

(87) PCT Pub. No.: WO2011/046084
PCT Pub. Date: Apr. 21, 2011

(65) Prior Publication Data
US 2012/0205712 A1 Aug. 16, 2012

(30) Foreign Application Priority Data

Oct. 15, 2009 (JP) ................................. 2009-238690
Aug. 3, 2010 (JP) ................................. 2010-174761

(51) Int. Cl.
*H01L 33/00* (2010.01)
*H01L 29/205* (2006.01)
(Continued)

(52) U.S. Cl.
CPC ........ *H01L 33/486* (2013.01); *B29C 45/0046* (2013.01); *B29C 45/14655* (2013.01);
(Continued)

(58) Field of Classification Search
CPC ........ B29C 2045/0027; B29C 45/0046; B29C 45/14655; B29C 45/34; H01L 2924/00;
(Continued)

(56) References Cited

U.S. PATENT DOCUMENTS 5,018,003 A * 5/1991 Yasunaga et al. ............ 257/791
6,344,162 B1 2/2002 Miyajima
(Continued)

FOREIGN PATENT DOCUMENTS

EP 1156535 A1 11/2001
EP 1312455 A2 5/2003
(Continued)

OTHER PUBLICATIONS

Extended European Search Report of the corresponding European Application No. 10823352.9, dated Jun. 28, 2014.
(Continued)

*Primary Examiner* — Mark Tornow
*Assistant Examiner* — Priya Rampersaud
(74) *Attorney, Agent, or Firm* — Global IP Counselors, LLP

(57) ABSTRACT

A light-emitting device includes a light emitting element, a resin package defining a recessed portion serving as a mounting region of the light emitting element, gate marks each formed on an outer side surface of the resin package, and leads disposed on the bottom surface of the recessed portion and electrically connected to the light emitting element. The light emitting element is mounted on the lead. The gate marks include a first gate mark formed on a first outer side surface of the resin package and a second gate mark formed on an outer side surface which is different than the first outer side surface.

27 Claims, 16 Drawing Sheets

(51) Int. Cl.
*H01L 33/48* (2010.01)
*B29C 45/00* (2006.01)
*B29C 45/14* (2006.01)
*B29C 45/34* (2006.01)

(52) U.S. Cl.
CPC ...... *B29C 45/34* (2013.01); *B29C 2045/0027* (2013.01); *H01L 2224/48091* (2013.01); *H01L 2224/48247* (2013.01); *H01L 2924/12044* (2013.01); *H01L 2924/3025* (2013.01); *H01L 2933/0033* (2013.01)

(58) Field of Classification Search
CPC . H01L 2224/48091; H01L 2924/12044; H01L 2924/3025; H01L 2924/00014; H01L 2224/48247; H01L 2933/0033; H01L 33/486
See application file for complete search history.

(56) References Cited

U.S. PATENT DOCUMENTS

| | | | |
|---|---|---|---|
| 6,608,334 B1* | 8/2003 | Ishinaga | B29C 45/0046 257/100 |
| 8,525,307 B2* | 9/2013 | Ito | H01L 23/047 257/666 |
| 2003/0122281 A1 | 7/2003 | Osawa et al. | |
| 2003/0132701 A1* | 7/2003 | Sato et al. | 313/503 |
| 2008/0157113 A1 | 7/2008 | Hayashi | |
| 2008/0224161 A1* | 9/2008 | Takada | 257/98 |
| 2008/0268559 A1 | 10/2008 | Jung | |
| 2009/0087931 A1* | 4/2009 | Lee et al. | 438/26 |
| 2009/0289275 A1 | 11/2009 | Hayashi | |
| 2010/0314654 A1* | 12/2010 | Hayashi | H01L 33/486 257/99 |
| 2010/0330714 A1 | 12/2010 | Jung et al. | |
| 2012/0295374 A1 | 11/2012 | Hayashi | |
| 2016/0190413 A1* | 6/2016 | Abe | H01L 33/62 257/99 |

FOREIGN PATENT DOCUMENTS

| | | |
|---|---|---|
| EP | 2109157 A1 | 10/2009 |
| JP | 56-94635 | 7/1981 |
| JP | 63-015432 A | 1/1988 |
| JP | 2001-168400 A | 6/2001 |
| JP | 2002-43345 | 2/2002 |
| JP | 2005-353814 A | 12/2005 |
| JP | 2006-156704 A | 6/2006 |
| KR | 20-0335192 U | 11/2003 |
| KR | 20070008269 A1 | 1/2007 |
| KR | 2009-0028698 A | 3/2009 |
| KR | 2009-0032205 A | 4/2009 |
| KR | 2009-0103473 A | 10/2009 |
| TK | WO2008/081696 A1 | 7/2008 |

OTHER PUBLICATIONS

M. Zhai et al., Runner sizing and weld line positioning for plastics injection moulding with multiple gates, Engineering with Computers, May 1, 2006, vol. 21, p. 218-224.

Bozzelli, Weak Weld Lines in Injection Molding Can Be Improved With Simple Measures, Jan. 1, 2013, XP055262185, retrieved from the §: URL:http://www.plastemart.com/upload/Literature/Weak-weld-knit-lines-in-injection-molding-can-be-improved-simple-measures.asp.

Office Action of the corresponding European Patent Application No. 10 823 352.9, dated Apr. 8, 2016.

* cited by examiner

LIGHT-EMITTING DEVICE AND METHOD FOR MANUFACTURING SAME

CROSS-REFERENCE TO RELATED APPLICATIONS

This national phase application claims priority to Japanese Patent Application No. 2009-238690 filed on Oct. 15, 2009 and Japanese Patent Application No. 2010-174761 filed on Aug. 3, 2010. The entire disclosures of Japanese Patent Application Nos. 2009-238690 and 2010-174761 are hereby incorporated herein by reference.

FIELD OF THE INVENTION

The present invention relates to a light emitting device and a method of manufacturing the light emitting device.

DISCUSSION OF THE RELATED ART

A light emitting device using a light emitting element made of a semiconductor is known for compact size and excellent power efficiency, and bright color emission. Such a light emitting element has very low power consumption and exhibits excellent initial drive performance, good vibration resistance and durability to endure repetitive ON/OFF operations. Accordingly, such a light emitting device having excellent characteristics as shown above has been utilized as various kinds of light sources.

Such a light emitting device is described, for example in JP2001-168400A (FIG. 1 and FIG. 2), in which, the light emitting device includes a light emitting element, a mounting lead on which the light emitting element is mounted, a wiring lead connected to the light emitting element by a conductive wire, and a resin package (resin molded body) covering most part of each lead frame. The resin package has a rectangular outer shape in plan view, and is provided with a recessed portion 105 defined by a surface having a circular truncated cone shape tapering downward at approximately the center of the resin package. The mounting lead is arranged on the bottom surface of the recessed portion and the light emitting element is mounted on the upper surface of the mounting lead. A sealing member is disposed in the recessed portion. The sealing member is made of a light transmissive member and allows the light from the light emitting element to be emitted outside.

For such a light emitting device, generally, as shown in FIG. 18, the lead frames 102, 103 are respectively placed between the upper mold 111 having the protruding portion 117 and the lower mold 112, then, a resin is injected from each injection port 115 into the space defined by the upper mold 111 and the lower mold 112 to fill the space. Thereafter, the resin filled into the cavity is cured to form the resin package 104. In the above forming method, the resin is injected from the outside of the upper mold 112 through the portions arranged at the both of the opposing surfaces, thus allowing the resin to spread and fill the space 114.

JP2006-156704A (FIG. 10) discloses a method in which a thermosetting resin is filled in a space between an upper mold and a lower mold by way of transfer molding, however, there are no specific descriptions on the arrangement of the inlets nor on the directions of injection of the resin. WO2008/081696 (FIG. 1) discloses a light emitting device and a manufacturing method of the device in which mechanical strength of a resin package with a weld line is increased.

SUMMARY

The forming method described above is such that the inlet ports 115 for injecting the resin are arranged at opposing outer side surfaces of the resin package 104, which are at the both surfaces of a predetermined outer side surface and the opposite outer side surface. The resin is injected from those two inlet ports respectively locate at the opposite surfaces. Therefore, the resin injected from the both sides toward respective opposite walls flows in the cavity of the mold and mix in the space. Stress is generated at the joining part of the resin mixed in the space, caused by the resin pushed out from two opposite directions, so that gas traps tends to occur in the package which tends to introduce voids in the resin package. The voids reduce the strength of the resin package. A problem arises that when such a weld line is formed in the resin package, the strength of the resin package to be significantly reduced. A weld line is an uneven surface which occurs at a joining location of separate flows when a resin such as a thermosetting resin is injected in the space.

The present invention is devised to solve the problems described above and an object of the present invention is to provide a high-quality light-emitting device, in which higher strength is secured in a resin package having a recessed portion in its center portion, and a method of manufacturing the light emitting device.

The present invention includes the aspects described below.

(1) A light emitting device including a light emitting element, a resin package defining a recessed portion serving as a mounting region of the light emitting element, a gate mark formed on an outer side surface of the resin package, and a lead arranged on a bottom surface of the recessed portion electrically connected with the light emitting element mounted on the lead. The gate mark includes a first gate mark formed on a first outer side surface of the resin package and a second gate mark formed on an outer side surface of the resin package which is a different outer side surface than the first outer side surface.

(2) The light emitting device described above, in which the outer side surface provided with the second gate mark is arranged opposite side of the first outer side surface.

(3) The light emitting device described by either of the above, in which the first gate mark is arranged symmetrically with the second gate mark with respect to a straight line ($L_1$) passing through a center of the recessed portion and extending in a direction in parallel to the first outer side surface.

(4) The light emitting device described by any one of the above, in which at least one of the first gate mark and the second gate mark is arranged on a straight line ($L_2$) passing through the center of the recessed portion and extending in a direction perpendicular to the first outer side surface.

(5) The light emitting device described by any one of the above, in which the first gate mark and the second gate mark are arranged asymmetrically with respect to the straight line ($L_1$) passing through a center of the recessed portion and extending in a direction in parallel to the first outer side surface.

(6) The light emitting device described by any one of the above, in which the first gate mark and the second gate mark are arranged so that in the recessed portion, a straight line ($L_a$) connecting a center of the first gate mark and a center of the second gate mark intersects the straight line ($L_2$) passing through the center of the recessed portion and extending in a direction perpendicular to the first outer side surface.

(7) The light emitting device described by any one of the above, in which the center of the first gate mark is not on the straight line ($L_2$).

(8) The light emitting device described by any one of the above, in which the center of the second gate mark is not on the straight line ($L_2$).

(9) The light emitting device described by any one of the above, in which the outer side surface provided with the second gate mark is arranged adjacent to the first outer side surface. The second gate mark is arranged on an opposite other side of the first gate mark with respect to the line ($L_1$) passing through the center of the recessed portion and extending in a direction in parallel to the first outer side surface. The second gate mark is also arranged on an opposite side of the first gate mark with respect to the line ($L_2$) passing through the center of the recessed portion and extending in a direction perpendicular to the first outer side surface.

(10) The light emitting device described by any one of the aspects (3) to (9), in which, when the light emitting device is viewed from a side of the first outer side surface, the second gate mark has a region which does not overlap with the first gate mark.

(11) The light emitting device described by any one of the above, in which the first gate mark or the second gate mark is formed by cutting a gate which is formed on an outer side surface at a time of injecting a material of the resin package in a designated mold.

(12) The light emitting device described by any one of the above, in which at least one of the first gate mark and the second gate mark is formed two or more on a same side surface.

(13) The light emitting device described by any one of the above, in which the resin package is made of a resin containing a triazine derivative epoxy resin.

(14) A method of manufacturing a light emitting device having a resin package having an outer side surface and defining a recessed portion serving as a mounting region of a light emitting element, and a lead arranged at a bottom surface in the recessed portion, the method includes: a step of holding a lead frame with an upper mold and a lower mold paired with the upper mold. The upper mold has a protruding portion which fits in with the recessed portion, an inlet port for injecting a resin provided on a first wall surface corresponding to the outer side surface, and an outlet port for releasing the resin which is injected from the inlet port, the outlet port being provided on a wall surface which is different than the first wall surface; a step of injecting a resin from the inlet port in a space defined by the upper mold and the lower mold to fill the mold cavity with the resin; a step of discharging the resin which is injected in the space from the outlet port; a step of curing the resin filled in the space to form a resin molded body; a step of removing the molds and cutting gates formed on the resin molded body at portions corresponding to the inlet port and the outlet port to form a first gate mark and a second gate mark on different outer side surfaces; and a step of mounting the light emitting element on the lead frame and electrically connecting the light emitting element with the lead frame.

(15) The method of manufacturing a light emitting device described above, in which the wall surface provided with the outlet port is arranged at a location opposite to the first wall surface with the protruding portion interposing therebetween.

(16) Any one of the above-described methods of manufacturing a light emitting device, in which the inlet port is arranged symmetrically with the outlet port with respect to a straight line ($L_3$) passing through a center of the protruding portion and extending in parallel to the first wall surface.

(17) Any one of the above-described methods of manufacturing a light emitting device, in which the inlet port and the outlet port are arranged on a straight line ($L_4$) passing through the center of the protruding portion and extending perpendicular to the first wall surface.

(18) Any one of the above-described methods of manufacturing a light emitting device, in which the inlet port and the outlet port are arranged asymmetrically with respect to the straight line ($L_3$) passing through a center of the protruding portion and extending in parallel to the first wall surface.

(19) Any one of the above-described methods of manufacturing a light emitting device, in which the inlet port and the outlet port are arranged so that a straight line ($L_4$) passing through the center of the protruding portion and extending perpendicular to the first wall surface and a straight line ($L_b$) passing through the center of the inlet port and the center of the outlet port intersect in the protruding portion.

(20) Any one of the above-described methods of manufacturing a light emitting device, in which the wall surface provided with the outlet port is arranged adjacent to the first wall surface, the outlet port is arranged on an opposite side from the inlet port with respect to the straight line ($L_3$) passing through the center of the protruding portion and extending in a direction in parallel to the first wall surface, and the outlet port is also arranged on an opposite side from the inlet port with respect to the straight line ($L_4$) passing through the center of the protruding portion and extending in a direction perpendicular to the first wall surface.

(21) Any one of the above-described methods of manufacturing a light emitting device, in which the molds made of a pair of the upper mold and the lower mold are configured to define a plurality of mold cavities for respectively forming a resin mold body. The outlet port provided to an n-th mold cavity is connected to an (n+1)th mold cavity which is arranged adjacent to the n-th mold cavity. The (n+1)th mold cavity is also connected to the inlet port provided to an (n+2)th mold cavity which is arranged adjacent to the (n+1)th mold cavity.

(22) Any one of the above-described methods of manufacturing a light emitting device, in which the plurality of mold cavities are arranged along a direction of resin injection and the inlet ports and the outlet ports respectively provided to the mold cavities are arranged on a straight line.

(23) Any one of the above-described methods of manufacturing a light emitting device in which the plurality of mold cavities are arranged along a direction of resin injection and the inlet ports and the outlet ports respectively provided to the mold cavities are arranged in a zigzag manner.

(24) Any one of the above-described methods of manufacturing a light emitting device, in which the plurality of mold cavities are alternately arranged in opposite positions so that an inlet port provided to a cavity also serves as the outlet port provided to an adjacent mold cavity.

(25) Any one of the above-described methods of manufacturing a light emitting device, in which the lead frame is provided with a hole or a groove.

(26) Any one of the above-described methods of manufacturing a light emitting device, in which after the step of electrically connecting the light emitting element and the lead frame, a step of disposing a sealing member in the recessed portion is performed.

(27) Any one of the above-described methods of manufacturing a light emitting device, in which the resin is a thermosetting resin and contains a triazine derivative epoxy resin.

According to the light emitting device and the method of manufacturing the light emitting device of the present invention, a resin package defining a recessed portion in its center is provided in the light emitting device, the strength of the resin package is further secured and the light emitting device of high quality can be manufactured easily and more reliably.

EMBODIMENTS FOR CARRYING OUT THE INVENTION

Hereinafter, embodiments to carry out the present invention will be described in detail with reference to the drawings. However, the present invention is not limited to the embodiments disclosed below.

Light Emitting Device

Embodiment 1

Figure 1A:
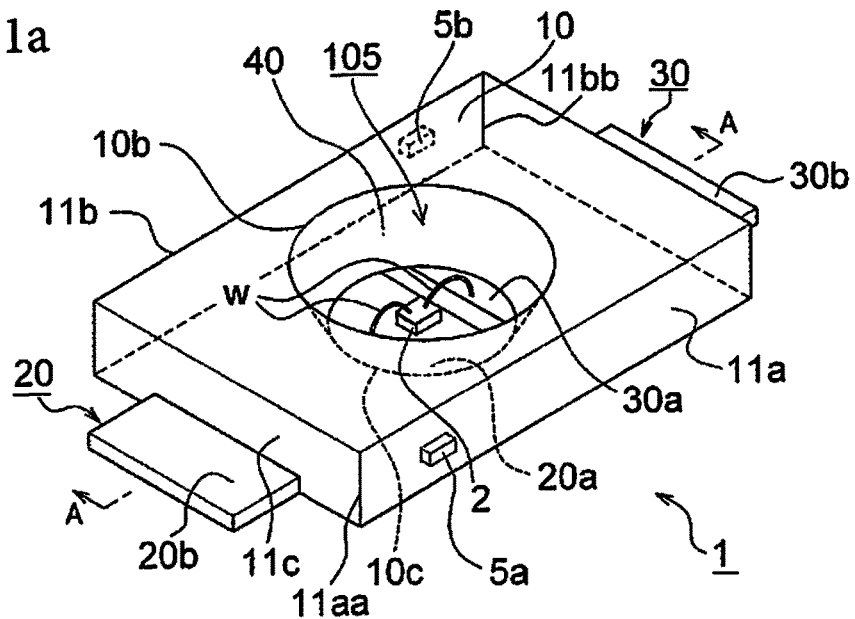
FIGS. 1a and 1b are perspective views showing a light emitting device according to an embodiment of the present invention.
Figure 1B:
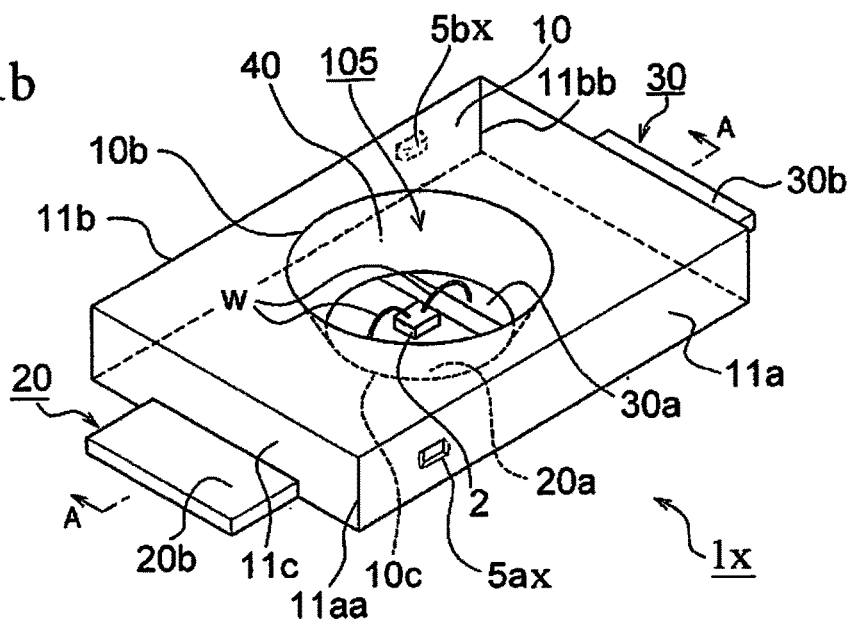
Figure 2A:
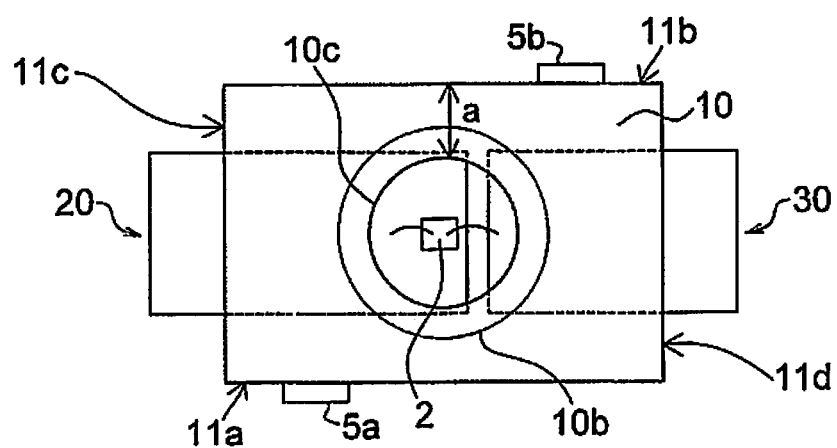
FIG. 2a is a plan view showing a light emitting device according to an embodiment of the present invention.
Figure 3:
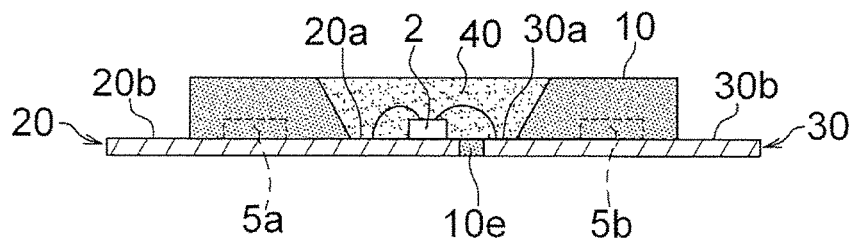
FIG. 3 is a cross-sectional view of a light emitting device according to an embodiment of the present invention showing FIGS. 1a and 1b in a direction of arrow line A-A.

FIGS. 1a and 1b are perspective views showing a light emitting device according to Embodiment 1 of the present invention. FIG. 2a is a plan view showing a light emitting device according to Embodiment 1 of the present invention. FIG. 3 is a cross-sectional view of a light emitting device according to the Embodiment 1 of the present invention, viewed in a direction of arrow line A-A in FIGS. 1a and 1b. The light emitting device 1 has a light emitting element 2, a resin package 10 defining a recessed portion 105 serving as a mounting region of the light emitting element 2, and a first lead 20 and a second lead 30 arranged on a bottom surface 10c in the recessed portion of the resin package 10 and respectively electrically connected to the light emitting element 2. The light emitting element 2 is mounted on a first inner lead 20a of the first lead and the first inner lead 20a and the light emitting element 2 are electrically connected by a wire W. A second inner lead 30a of the second lead is electrically connected to the light emitting element 2 by a wire. A sealing member 40 is filled in the recessed portion of the resin package.

Figure 2B:
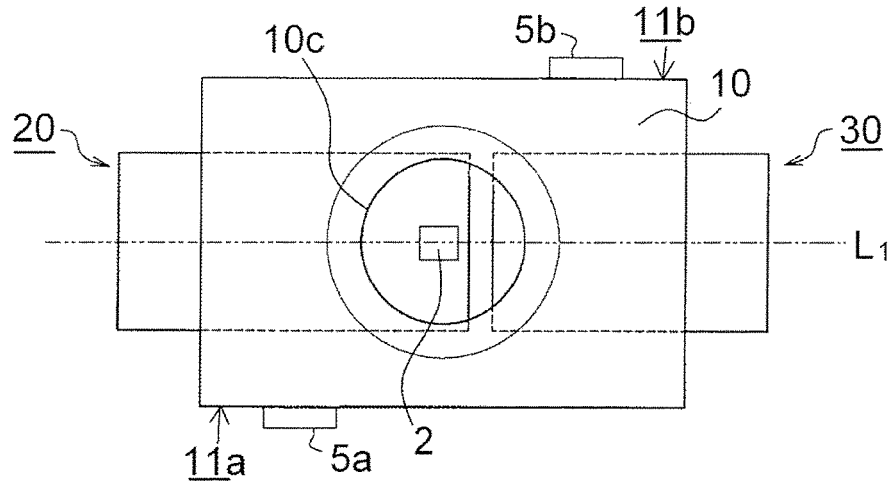
FIG. 2b is a plan view of a light emitting device according to an embodiment of the present invention showing a positional relationship between the straight line ($L_1$) and the gate marks.
Figure 2C:
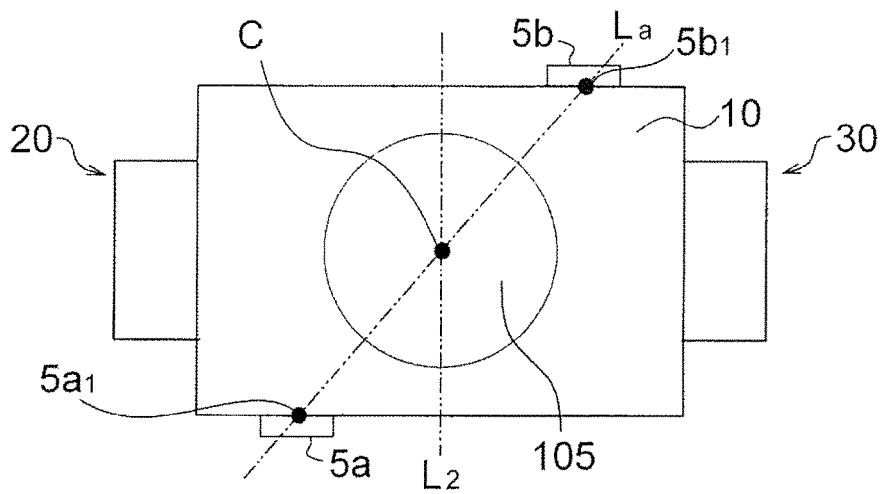
FIG. 2c is a plan view of a light emitting device according to an embodiment of the present invention showing a positional relationship between the straight line ($L_2$) and the straight line ($L_3$).

The resin package has at least a first outer side surface 11a and a second outer side surface 11b as the outer side surfaces constituting the contour of the resin package. A first gate mark 5a is formed on the first external side surface and a second gate mark 5b is formed on the second external surface respectively. The first gate mark 5a and the second gate mark 5b are arranged asymmetrically with respect to the straight line $L_1$ (FIG. 2b). In the present specification, the straight line $L_1$ refers to a straight line passing through (intersecting) the center "c" of the recessed portion 105 and extending in a direction in parallel with the first outer side surface 11a. The first gate mark 5a and the second gate mark 5b are formed so that the straight line $L_2$ and the straight line $L_a$ intersect in the light emitting device (preferably in the recessed portion of the package, more preferably at the center "c" of the recessed portion) as shown in FIG. 2c. In FIG. 2c, members such as the light emitting element 2 are not shown for simplifying the relation between the straight line $L_2$ and the straight line $L_a$. In the present specification, the term "straight line $L_2$" refers to a straight line passing through the center "c" of the recessed portion and extending in a direction perpendicular to the first outer side surface and the term "straight line $L_a$" refers to a straight line passing through the center $5a_1$ of the first gate mark and the center $5b_1$ of the second gate mark.

In the case where the first gate mark 5a formed on the first outer side surface 11a is locate closer to the end portion of the first outer lead 20b with respect to the straight line L2, the second gate mark 5b formed on the second outer side surface 11b is preferably formed closer to the end portion of the second outer lead 30b. With such an arrangement, the first gate mark and the second gate mark can be arranged in the light emitting device along a diagonal line or at a longest possible distance, which facilitates manufacturing of the resin molded body to be described later. Accordingly, occurrence of inner voids in the resin package can be suppressed and a resin package free from cracks and having high strength can be obtained. The term "arrangement along a diagonal line" refers to an arrangement on a diagonal line or in a region in the vicinity of the diagonal line.

It is preferable that the center $5a_1$ of the first gate mark is not arranged on the straight line $L_2$, and the center $5b_1$ of the second gate mark is not arranged on the straight line $L_2$. It is more preferable that both the first gate mark and the second gate mark are not arranged on the straight line $L_2$. However, depending on the size or the like of the light emitting device, at least one of the first gate mark and the second gate mark may be arranged on the straight line $L_2$. It is more preferable that when viewed from the first outer side surface side, the center of the first gate mark formed on the first outer side surface is arranged so as not to overlap with the center of the second gate mark formed on the second outer side surface which is at the opposite side.

Generally, the portion of the wall of a resin package that has smallest thickness due to the arrangement of the recessed portion has weak strength. Such portion is, for example, a region referred as region "a" in FIG. 2a, and the region "a" is generally located on the straight line $L_2$ (see FIG. 2c). Therefore, forming a gate mark at a location avoiding the region "a" enables to suppress weakening of the strength of the resin package.

According to the light emitting device described above, occurrence of inner voids in the resin package can be prevented which enables the portions with weak strength to disperse within the light emitting device, so that occurrence of cracks can be prevented.

Figure 9:
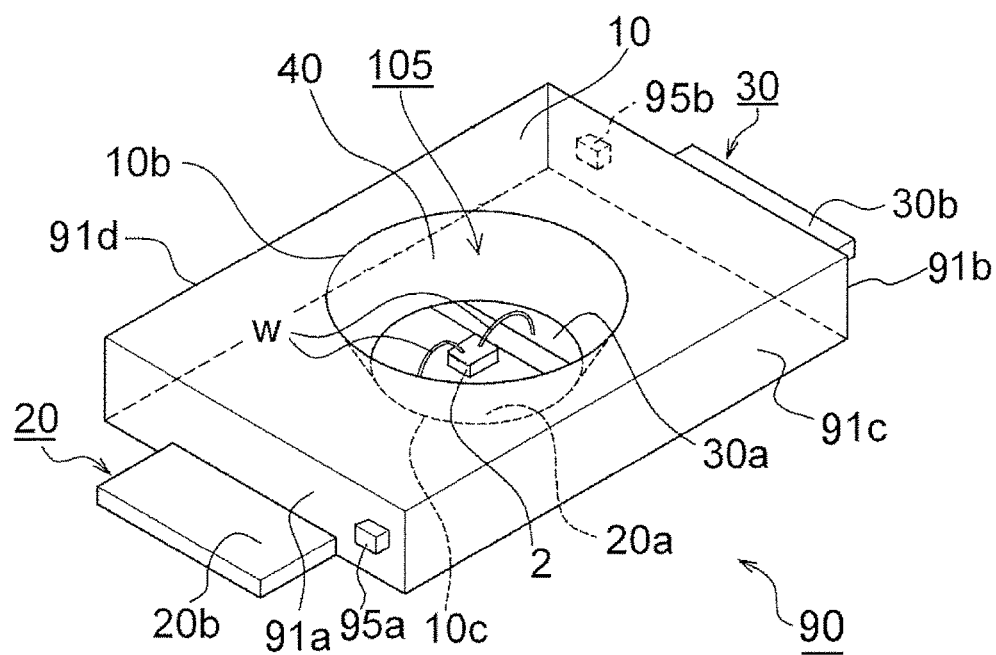
FIG. 9 is a perspective view showing a light emitting device according to another embodiment of the present invention.

The resin package 10 shown in FIGS. 1a and 1b has outer side surfaces in which the first outer side surface 11a and the second outer side surface 11b, which are opposite from each other, do not have the outer leads 20b, 30b of a pair of leads 20, 30 extended thereto, but as in the light emitting device 90 shown in FIG. 9, the outer side surfaces having the outer leads 20b, 30b respectively extended thereto may be designated as the first outer side surface 91a and the second outer side surface 91b. That is, it may be such that the first gate mark 95a is formed on the first outer side surface 91a on which the outer lead 20b is extended and the second gate mark 95b is formed on the second outer side surface 91b on which the outer lead 30b is extended. The same positional relationship as described above can be applied to the corresponding portions while the outer side surfaces adjacent to the first outer side surface 91a and the second outer side surface 91b are respectively designated as the third outer side surface 91c and the fourth outer side surface 91d.

Embodiment 2

Figure 10:
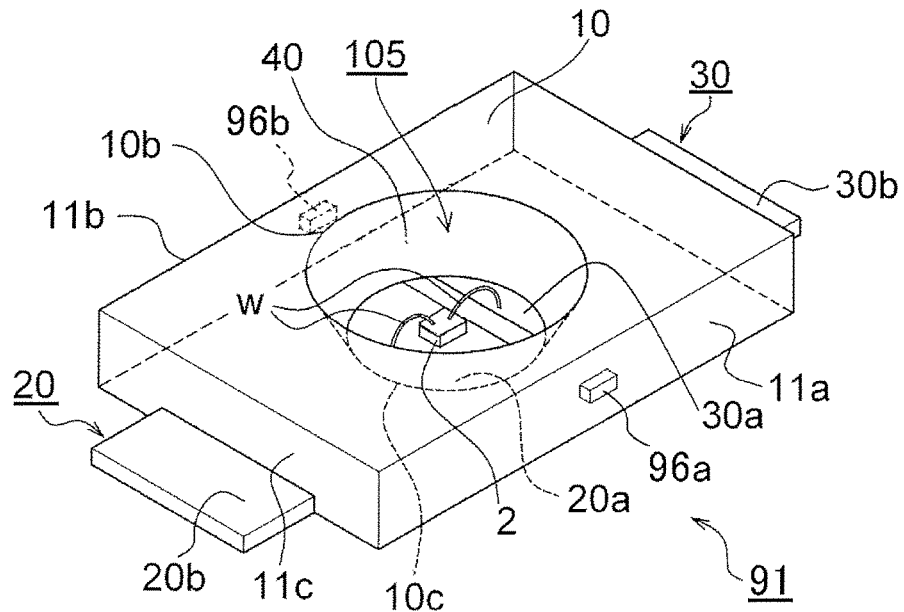
FIG. 10 is a perspective view showing a light emitting device according to yet another embodiment of the present invention.
Figure 11:
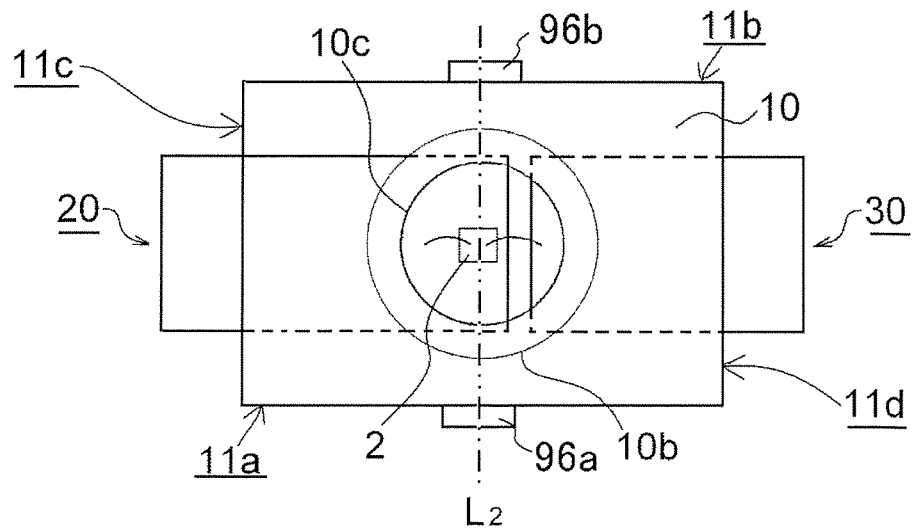
FIG. 11 is a plan view showing a light emitting device shown in FIG. 10.

As shown in FIG. 10 and FIG. 11, a light emitting device 91 according to the present embodiment has the first gate mark 96a formed on the first outer side surface 11a and the second gate mark 96b formed on the second outer side surface 11b which is opposite to the first outer side surface 11a. The first gate mark 96a and the second gate mark 96b may be arranged symmetrically with respect to the straight line $L_1$. Particularly, It is preferable that the first gate mark 96a and the second gate mark 96b are arranged symmetrically while at least one of the first gate mark 96a and the second gate mark 96b is arranged on the straight line $L_2$. The same positional relationships as in Embodiment 1 may be applied except for the arrangement of the gate marks. In such positional arrangement, the first gate mark 96a and the second gate mark 96b can be arranged facing each other in the light emitting device, which facilitates the manufacturing of the resin molded body described later.

Embodiment 3

Figure 12:
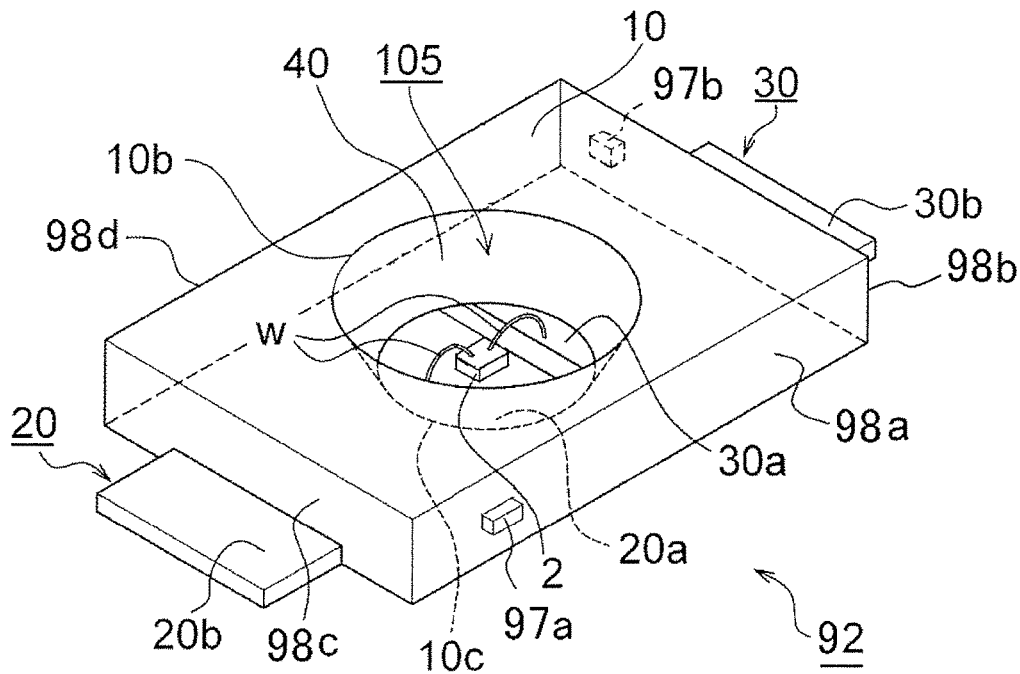
FIG. 12 is a perspective view showing a light emitting device according to yet another embodiment of the present invention.
Figure 13:
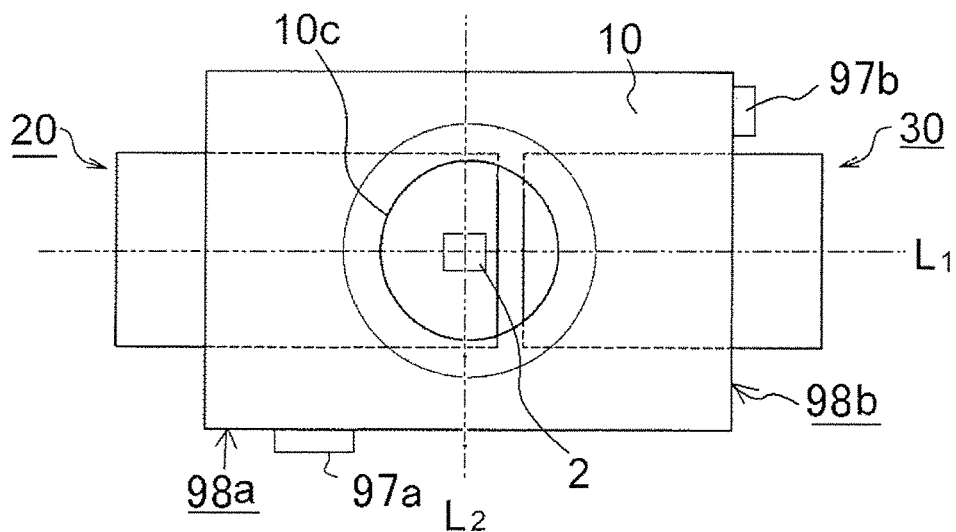
FIG. 13 is a plan view showing a light emitting device shown in FIG. 12.

The light emitting device 92 according to the present embodiment has a configuration as shown in FIG. 12 and FIG. 13 in which the resin package has at least a first outer side surface 98a and a second outer side surface 98b adjacent to the first outer side surface as the outer side surfaces constituting the contour of the resin package. A first gate mark 97a is formed on the first outer side surface and a second gate mark 97b is formed on the second outer side surface 98b respectively. The second gate mark 97b in this case is arranged at the opposite side from the first gate mark 97a with respect to the straight line $L_1$, and also at the opposite side from the first gate mark 97a with respect to the straight line $L_2$. Substantially the same positional relationship as in Embodiment 1 can be applied to the corresponding portions while the outer side surfaces adjacent to the first outer side surface 98a and the second outer side surface 98b are respectively designated as the third outer side surface 98C and the fourth outer side surface 98d. With such an arrangement, the first gate mark 97a and the second gate mark 97b can be arranged in the light emitting device along a diagonal line or at a distance as long as possible, which facilitates manufacturing of the resin molded body to be described later.

Now, each component of the light emitting device according to the present invention common to all the preferred embodiments described above will be described in detail below. In the present specification, a molded body which will be described later is made of the resin package 10, the first lead 20, and the second lead 30 may be referred to as a package.

Resin Package

The resin package 10 is a member capable of reflecting light from the light emitting element 2 disposed in the recessed portion at an inner wall surface defining the recessed portion to emit outside efficiently. It is preferable that the resin package has, for example after thermally curing a resin molded body, a reflectance to light having a wavelength in a range of 350 nm to 800 nm be 70% or greater, more preferably 80% or greater, and further preferably 85% or greater.

The resin package 10 is preferably formed by using a thermosetting resin. For the thermosetting resin, an epoxy resin, a triazine derivative epoxy resin, a modified epoxy resin, a silicone resin, a modified silicone resin, an acrylate resin, a urethane resin, or the like can be used. Among those, a triazine derivative epoxy resin is more preferably used. A triazine derivative epoxy resin has an excellent fluidity, so that it can be filled well even in a resin molded body (a mold) having a complicated shape. In the case where a triazine derivative epoxy resin is used for the resin package, the reflectance with respect to light of 420 nm to 520 nm can be 80% or greater.

The thermosetting resin may contain various additives such as an acid anhydride, an antioxidant, a mold release agent, a light reflective member, an inorganic filler, a curing catalyst, a diffusing agent, a pigment, a fluorescent material, a reflective material, a light blocking material, a light stabilizer, and a lubricant. Examples of the light reflective member include titanium dioxide. In this case, 5 to 60 wt % of titanium dioxide can be added in the resin. Mixing a light blocking material in the thermosetting resin enables to reduce the amount of light transmitting through the resin package. Alternatively, mixing a diffusing agent in the thermosetting resin allows light from the light emitting device to emit uniformly in a direction toward the light emitting surface side and in lateral direction. In order to reduce absorption of light, it is preferable to add a pigment of a white color rather than a pigment of a darker color.

The outer side surfaces constituting the resin package are not limited to that in the embodiments described above and are not limited to four surfaces, and three surfaces or five or more surfaces may be employed. That is, the resin package can be formed not only in a rectangular parallelepiped shape or a cuboid shape, but also in a columnar shape, a triangular prism shape or a polygonal prism shape of five or more edges, or a shape similar to those. The resin package may have a partially curved surface or a partially uneven surface. When the contour of the resin package is made with four surfaces, the outer side surfaces have a third outer side surface (for example, 11C in FIGS. 1a and 1b) and a fourth outer side surface (for example, 11d in FIGS. 1a and 1b) in addition to a first outer side surface (for example 11a in FIG. 1) and a second outer side surface (for example, 11b in FIGS. 1a and 1b). The positional relationship of respective outer side surfaces is not specifically limited and may be any one of those described above.

It is preferable that the recessed portion 105 of the resin package is defined by a side surface portion 10b and a bottom surface portion 10C with a profile of inverted frustum of a cone narrowing toward the bottom surface portion 10C. Light emitted from the light emitting element 2 is reflected by the side surface portion 10b, so that the light can be concentrated or diffused by appropriately changing the angle of the side surface portion 10b. The resin package is integrally molded with each lead, so that the bottom surface portion 10C defining the recessed portion includes the first lead 20, the second lead 30, and an interstitial portion 10e which is a part of the resin package 10. The interstitial portion 10e is arranged between the first lead portion 20 and the second lead portion 30 so that the first lead 20 and the second lead do not result in a short circuit.

Herein, the recessed portion 105 may be defined as an untapered cylinder shape. The side surface portion 10b is not necessarily flat and the side surface portion 10b may be formed with an irregular surface. The recessed portion 105 may be provided with a shape in a plan view such as a circle, a quadrangle, an approximately circle, an approximately oval, or an approximately quadrangle.

Gate Mark

A gate mark generally refers to a projection located on an outer side surface of the resin package 10. The gate mark may be made into a shape which is not a projection (a convex shape) but is a recess, according to the cutting method which to be described later. In the present specification, the term "gate mark" includes such variations in shape. Generally, the resin package of a light emitting device is formed such that, first, preparing a mold for manufacturing a resin molded body, and next, injecting a resin from an inlet port 81 formed in the mold, releasing the injected resin from the outlet port 82 formed in the mold, and cure the resin in the mold. Thus, projecting objects are formed on the obtained resin molded body at the portions corresponding to the inlet port and the outlet port. The projecting objects are cut off when finishing the shape of the resin molded body, but may remain on the outer side surface of the resin package as a projection or as a depression that is, for example, shown in FIG. 1b. In this specification, a term "resin molded body" is applied from the step of injecting the resin in the mold to the step of cutting the gate portions after removing the molded body from the mold, and a term "resin package" is applied afterwards. However, the terms are not strictly limited thereto.

The shape of the gate marks is not specifically limited, but the gate marks are generally formed to project perpendicularly from the outer side surface of the resin package 10. The shape of the gate marks can be adjusted appropriately according to the cross-sectional shape of the inlet ports or the outlet ports of the mold. Particularly, the cross sectional shape of the gate marks is preferably rectangular, square, semicircular, or oval, for the sake of improvement in mass productivity and mechanical strength.

The width of the gate marks is 100 µm or more, preferably 250 µm or more, and further preferably 500 µm or more. The height of the gate marks is less than the thickness of the resin package, and for example, 50 µm or more, preferably 100 µm or more, and further preferably 150 µm or more. With the size of the gate marks is in the range described above, a region having weak strength in the resin package and a weld line can be spaced apart while maintaining the strength of the resin package. The positions of the gate marks are not particularly limited but, for example, are preferably such that an end of a gate mark is 200 µm or more away from the nearest end portion of the adjacent outer side surface (for example, in FIGS. 1a and 1b, 11aa with respect to the gate mark 5a, and 11bb with respect to the gate mark 5b). Depending on the size or the like of the light emitting device, a part of the gate mark may be arranged at a corner portion of the resin package.

Lead, Lead Frame

In the present specification, the term "lead" is used in the light emitting devices which are individually separated, and the term "lead frame" is used in the steps prior to individually separating the light emitting devices.

The lead frame is made by using a good electric conductor such as iron, phosphor bronze, and a copper alloy. In order to improve the reflectance of light from the light emitting element, it is suitable that a plating treatment is performed on the surface of the lead disposed at the bottom surface of the recessed portion of the package. Examples of the plating include a metal plating using silver, aluminum, copper, gold, or the like. The plating treatment can be performed before cutting out the resin molded body, but it is preferable to use a lead frame which has been subjected to a plating treatment beforehand. That is, the metal plating is preferably applied before the lead frame is held between the upper mold and the lower mold. Meanwhile, it is preferable that the side surfaces of the lead are not subjected to a plating treatment. The lead frame preferably has a smooth surface to improve the surface reflectance.

The lead frame is made by punching or etching a flat metal sheet. An irregularity is formed in a cross-sectional shape in an etched lead frame so that adhesion with the resin molded body can be improved. Surface irregularity can be formed in all the cross-sectional portions (etched portions) of the etched lead frame. Therefore, the joining area of the lead frame and the resin molded body can be enlarged and thus a resin package with greater adhesion can be formed. The lead frame may be formed with a metal sheet provided with a step or an irregular surface in addition to such surface irregularity can also be used.

The leads are provided so that a pair of the leads is placed spaced apart from each other (interstitial portion 10e) in the light emitting device (in particular at a lower part of the resin package 10), and as shown in FIGS. 1a and 1b, FIG. 3, and the like, serves as a pair of positive and negative electrodes of the first lead 20 and the second lead 30 to electrically connect external electrodes (not shown) and the light emitting element respectively. The leads are extended from the bottom surface portion 10C in the recessed portion of the resin package 10 outwardly to respective sides.

As shown in the cross-sectional view of FIG. 3, the first lead 20 has a first inner lead 20a forming the bottom surface 10C of the recessed portion 10a and a first outer lead 20b exposed outwardly from the resin package 10. The back surface of the first lead 20 is also referred to as the first outer lead 20b. The first inner lead 20a forms a part of the bottom surface 10C of the recessed portion where the light emitting element 2 is mounted through a die bonding member. The first inner lead 20a and the light emitting element 2 are electrically connected by a wire. In the meantime, in a case where the light emitting element 2 is mounted in a face-down manner, the wire is not necessary.

The second lead 30 has a second inner lead 30a forming the bottom surface 10C of the recessed portion and a second outer lead 30b exposed outwardly from the resin package 10. The back surface of the second lead 30 is also referred to as the second outer lead 30b. The second inner lead 30a forms a part of the bottom surface 10C of the recessed portion 10a and electrically connected with the light emitting element 2 through a wire 21. In a case where the light emitting element 2 is mounted in a face-down manner, the wire is also not necessary together with the wire connected to the first inner lead portion described above.

The first lead 20 and the second lead 30 are not limited to leads formed in a rectangular shape in plan view. These leads are sufficient to be at least a pair of positive and negative electrodes, and an electrode can be provided as well as the first lead and the second lead. The lead frame may be provided with a hole or a groove in a region to be enclosed in the resin in a later step. Further, among such regions, a cut may be provided at an edge of a lead frame, or the shape of a part of the edge may be changed by bending. With such a processing, the contact area with the resin package can be increased which enables to improve the adhesion between the lead frame and the resin package. Further, as shown in FIG. 3, the lead has a lower surface which is in conformity with the lower surface of the resin package. In other words, the lower surface of the lead is provided so as not to be covered with the resin package, which facilitates releasing of heat from the light emitting element to outside. But, it is not limited to such a configuration, and the resin package may also be provided at the lower surface of the lead. The outer leads are, as shown in FIG. 3, provided protruded from the resin package without being bent or bent downward, upward, forward, or backward so that the outer leads have the same height as the mounting region of light emitting element.

Light Emitting Element

The light emitting element 2 is a member for emitting light and mounted on the lead and electrically connected with the first lead 20 and the second lead 30 described above. The light emitting element 2 is made of a semiconductor. Examples thereof include a blue light emitting LED, an ultraviolet light emitting LED, and the like, which are made of nitride semiconductors. A nitride semiconductor is represented by general formula $Al_xGa_yIn_zN$, $0 \leq x \leq 1$, $0 \leq y \leq 1$, $0 \leq z \leq 1$, $x+y+z=1$). The light emitting element can be formed with, for example, a nitride semiconductor such as InN, AlN, InGaN, AlGaN, or InGaAlN is epitaxially grown on a substrate by using a vapor phase growth method such as MOCVD. The light emitting element can be made by using a semiconductor such as ZnO, ZnS, ZnSe, SiC, GaP, GaAlAs, or AlInGaP, as well as by using a nitride semiconductor. For such a semiconductor, a stacked-layer structure with an n-type semiconductor layer, a light emitting layer, a p-type semiconductor layer disposed in this order, can be used. For the light emitting layer (active layer), a stacked-layer semiconductor with a multiquantum well structure or a single quantum-well structure, or a stacked-layer semiconductor with a double-hetero structure is preferably used.

The emission wavelength of the light emitting element can be variously selected from ultraviolet light to infrared light according to the materials and the mixed crystal ratio (composition ratio) of the semiconductor. The light emitting element 10 preferably has an emission peak wavelength in a range of 360 nm to 520 nm, but a range of 350 nm to 800 nm can also be employed. It is particularly preferable that the light emitting element 10 has an emission peak wavelength in a range of 420 nm to 480 nm, which is the shorter wavelength range of visible light.

The light emitting element 2 may be of either a face-up mounting type or a flip-chip mounting type. There can be also employed either a type having the n-side electrode and the p-side electrode formed on the same surface side or a type having the n-side electrode and the p-side electrode formed on the different surfaces of the substrate with using a conductive substrate. The number of the light emitting elements mounted in the recessed portion of the resin package is not limited to one and a plural number of them can be used. These may be of the same type or each of the light emitting elements may have a different emission peak wavelength. For example, three light emitting elements are used to emit light of the three primary colors of red, green, or blue respectively.

The light emitting element is, generally, as shown in FIGS. 1a and 1b and the like, electrically connected to the first lead 20 and the second lead 30 through respective wires. The wire W having properties of good ohmic contact, mechanical connectivity as well as electric and thermal conductivity is employed. For example, the thermal conductivity of 0.01 cal/(sec)(cm$^2$)(° C./cm) or greater is preferable and 0.5 cal/(sec)(cm$^2$)(° C./cm) or greater is more preferable. The electrical connection can be established by providing the wire W from directly on the light emitting element 2 to the wire bonding area.

Sealing Member

The sealing member 40 is a member disposed to cover the light emitting element 2 to protect the light emitting element 2 from external environment such as external forces, dusts, and moisture, as well as to emit light generated from the light emitting element 2 to the outside. The material of the sealing member is not specifically limited but a resin having excellent in thermo-resistance, weather-resistance, and light resistance is preferably used. Examples thereof include light transmissive thermosetting resins. For the thermosetting resin, the same material used for the resin package can be employed. In the present application, the term "light transmissive" refers to absorption of light emitted from the light emitting element suitably 50% or less, and preferably 40% or less, 30% or less, or 20% or less is preferable. Of those, a silicone resin is preferable for the sealing member. In order to render a specific function to the sealing member, a known material such as a filler, a diffusing agent, a pigment, a fluorescent material, and a reflective material may be mixed in the sealing member. Examples of the diffusing agent which can be suitably used include barium titanate, titanium oxide, aluminum oxide, and silicon oxide. In order to eliminate undesired wavelengths, an organic or inorganic coloring dye or coloring pigment can be contained in the sealing member. Moreover, a fluorescent material capable of absorbing light from the light emitting element and converting its wavelength can also be contained in the sealing member.

In a case where both the resin package 10 and the sealing member 40 are respectively made of thermosetting resin, thermosetting resins having similar physical properties such as thermal expansion coefficients are preferably selected. In such case, adhesion can be greatly improved. Moreover, a light emitting device having excellent thermal resistance, light resistance, resin fluidity, and the like can be provided.

Fluorescent Material

It is preferable that a fluorescent material is contained in the sealing member described above. The fluorescent material is not specifically limited as long as it can absorb light from the light emitting element and convert it into light of a different wavelength. An optical semiconductor device capable of emitting not only light of a wavelength emitted from the optical semiconductor element but also light of a desired color such as white light can be provided by containing the fluorescent material in the sealing member. Examples of the fluorescent material include a nitride-based fluorescent material, an oxynitride-based fluorescent material, and a sialon-based fluorescent material, each activated mainly with a lanthanoid element such as Eu or Ce; an alkaline-earth halogen apatite fluorescent material, an alkaline-earth metal borate halogen fluorescent material, an alkaline-earth metal aluminate fluorescent material, an alkaline-earth silicate fluorescent material, an alkaline-earth sulfide fluorescent material, an alkaline-earth thiogallate fluorescent material, an alkaline-earth silicon nitride fluorescent material, and a germinate, each activated mainly with a lanthanoid element such as Eu and/or a transition-metal element such as Mn, a rare-earth aluminate, a rare-earth silicate, and an alkaline-earth metal rare-earth silicate, each activated mainly with a lanthanoid element such as Ce, and an organic compound or an organic complex each activated mainly with a lanthanoid element such as Eu. Specifically, $(Y,Gd)_3(Al,G_a)_5O_{12}$:Ce, $(Ca,Sr,Ba)_2SiO_4$:Eu, $(Ca,Sr)_2Si_5N_8$:Eu, $CaAlSiN_3$:Eu are preferable.

Other

The light emitting device may further be provided with a Zener diode as a protective element. The Zener diode may be mounted on the lead at the inner bottom surface of the recessed portion spaced apart from the light emitting element. On the contrary, the arrangement may be such that a Zener diode is mounted on the lead at the inner bottom surface 10C of the recessed portion 105 of the resin package and the light emitting element is mounted on the Zener diode.

Method of Manufacturing Light Emitting Device

In the method of manufacturing a light emitting device according to the present invention, first, a mold for forming a resin package is prepared.

Embodiment 1

Figure 4A:
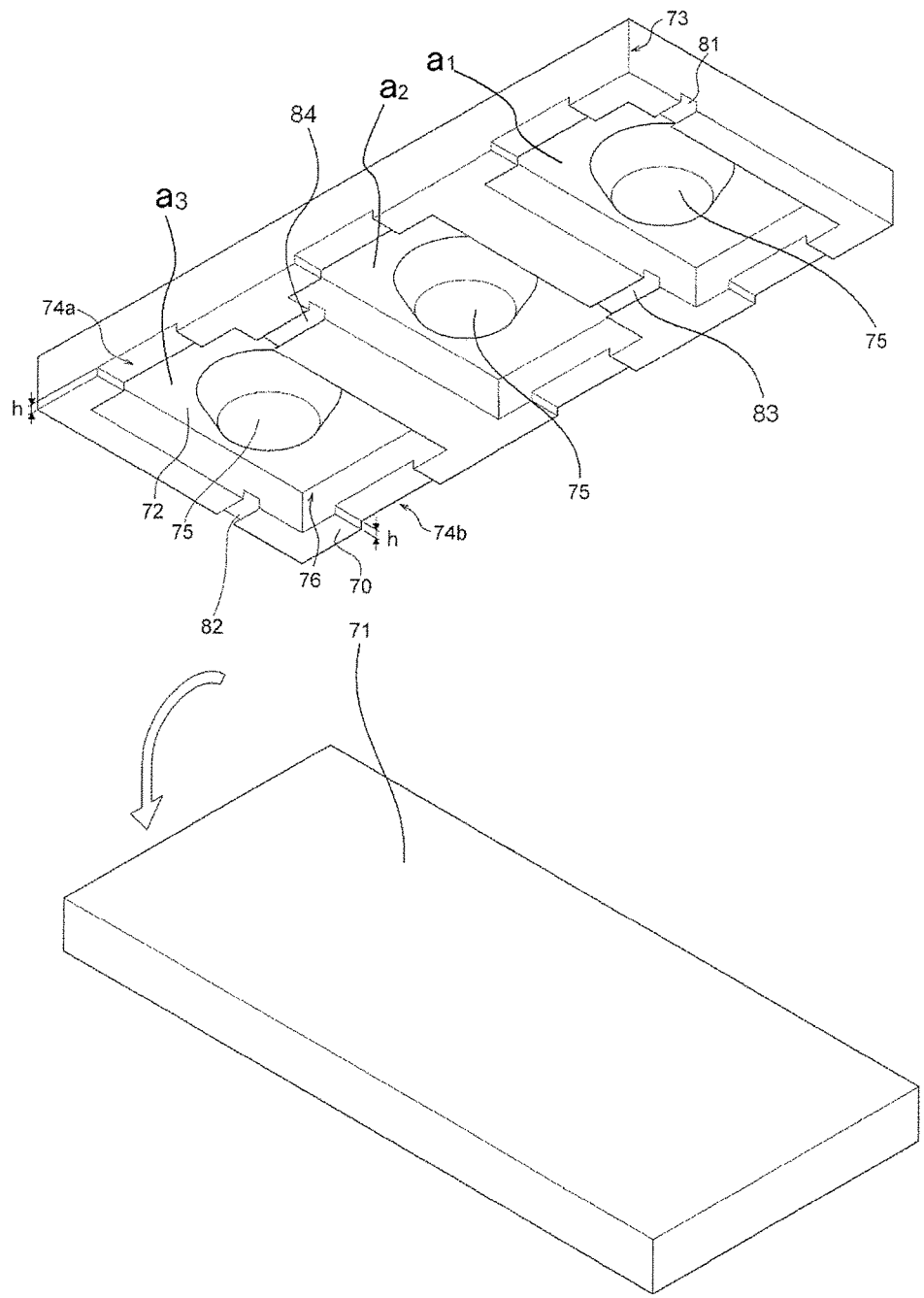
FIG. 4a is a perspective view showing a mold for use in manufacturing a resin molded body which is used for manufacturing a light emitting device according to an embodiment of the present invention.
Figure 4B:
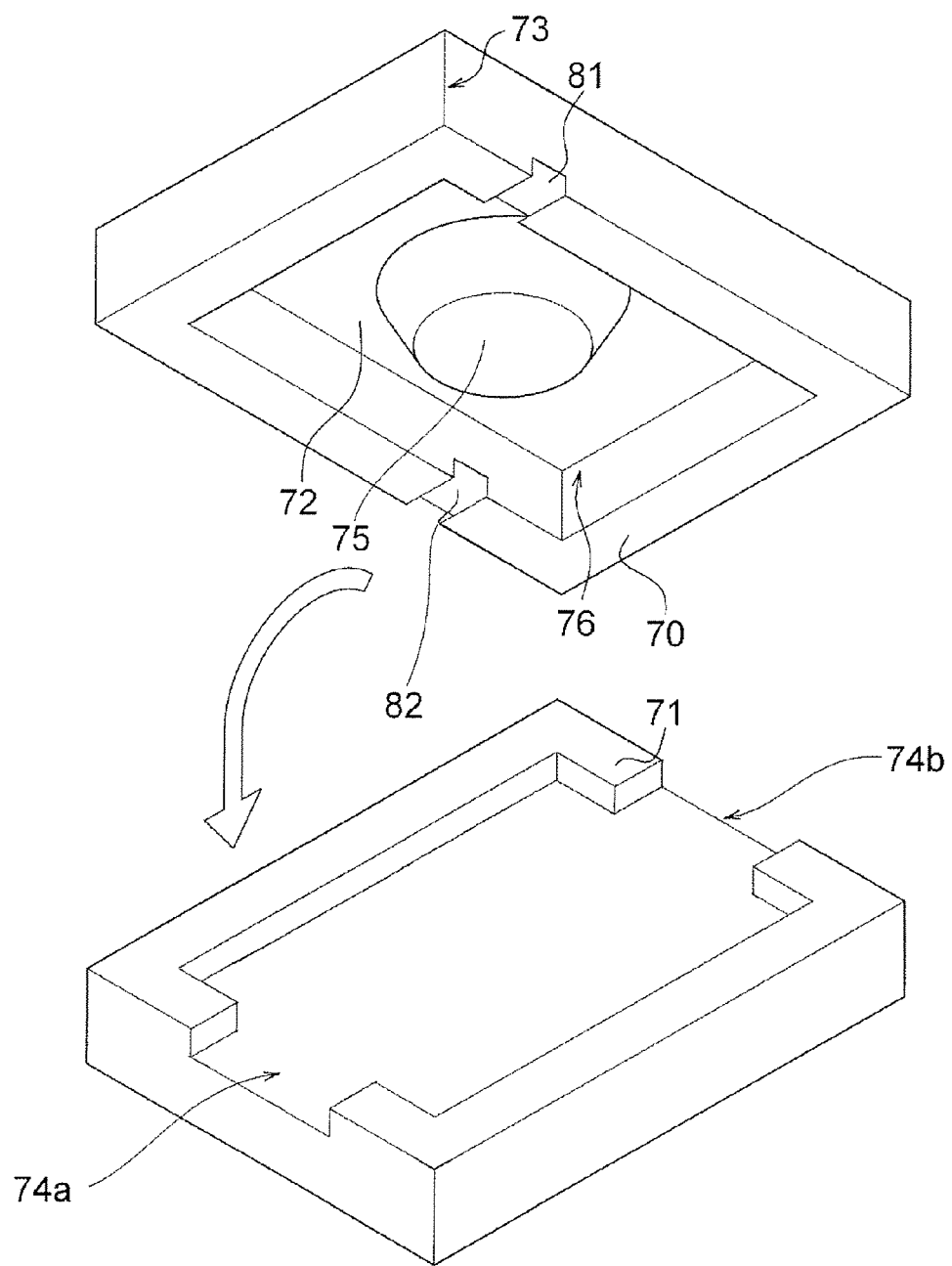
FIG. 4b is a perspective view showing a mold for use in manufacturing a resin molded body which is used for manufacturing a light emitting device according to an embodiment of the present invention.

FIG. 4a and FIG. 4b are perspective views each showing an upper mold for manufacturing a resin molded body which is used in the manufacturing the light emitting device of Embodiment 1. FIG. 5 is a cross-sectional view showing a method of manufacturing the light emitting device according to Embodiment 1. As shown in FIG. 4a, FIG. 4b, and FIG. 5, the mold used in Embodiment 1 is made up of an upper mold 70 and a lower mold 71. In the figures, an inlet port 81 and an outlet port 82 are provided in the upper mold, but the inlet port 81 and the outlet port 82 may be provided in the lower mold.

The upper mold 70 includes, as shown in FIG. 4a, a planar main portion 72 forming the upper portion of the upper mold 70, a wall portion 73 formed in a frame-shape from the end portion of the main portion 72, a first cut-off portion 74a and a second cut-off portion 74b provided in a pair of wall surfaces 73 in the wall surfaces 73, a protruding portion 75 defining the recessed portion of the resin package 10, and a groove portion 76 defined between the wall surfaces 73 and the protruding portion 75. Further, in the upper mold 70, an inlet port 81 and an outlet port 82 penetrate through a part of the respective wall surfaces 73 where a cut-off portion is not provided. The upper mold 70 may not be provided with a cut-off portion, as shown in FIG. 4b, and a cut-off portion may be provided in the lower mold. In such a case, the lead frame is positioned in the lower mold.

Figure 5C:
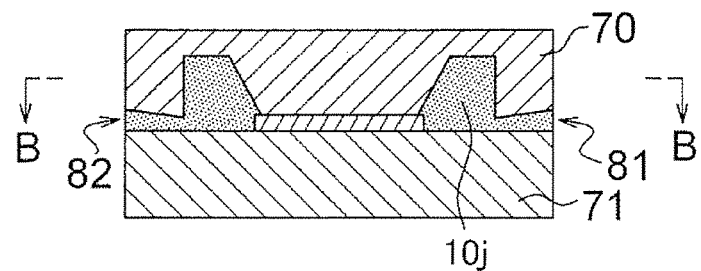
Figure 5D:
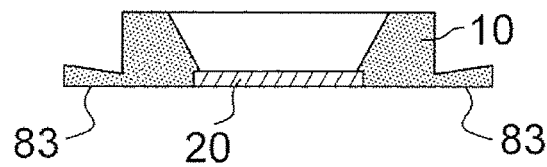
Figure 5E:
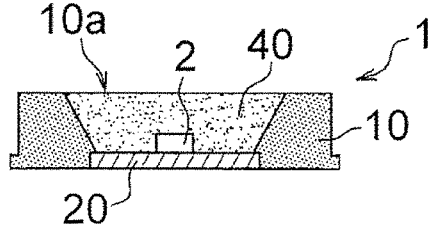
Figure 6A:
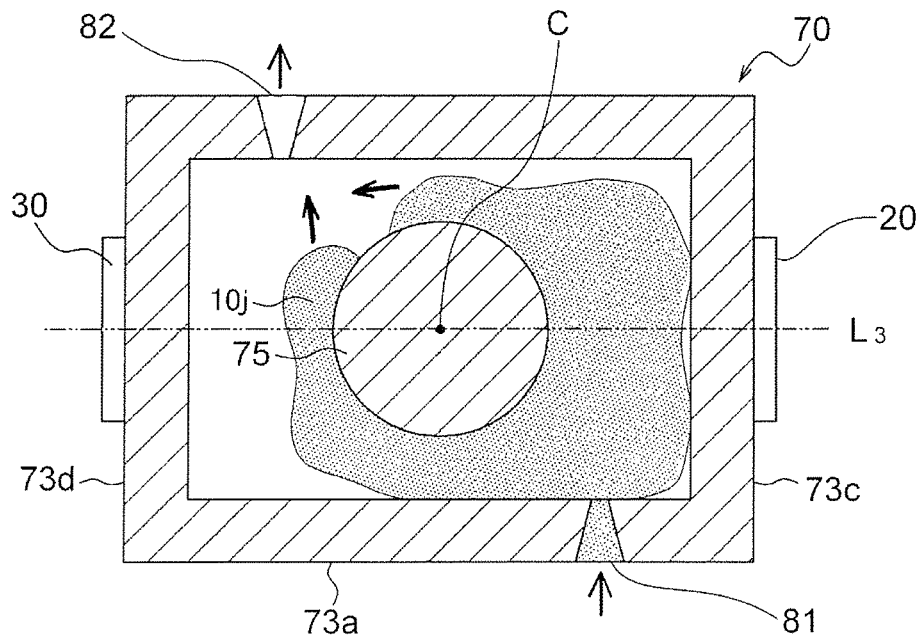
FIG. 6a is a plan sectional view of an upper mold according to an embodiment of the present invention, showing FIG. 5(c) in a direction of arrow line B-B.
Figure 6B:
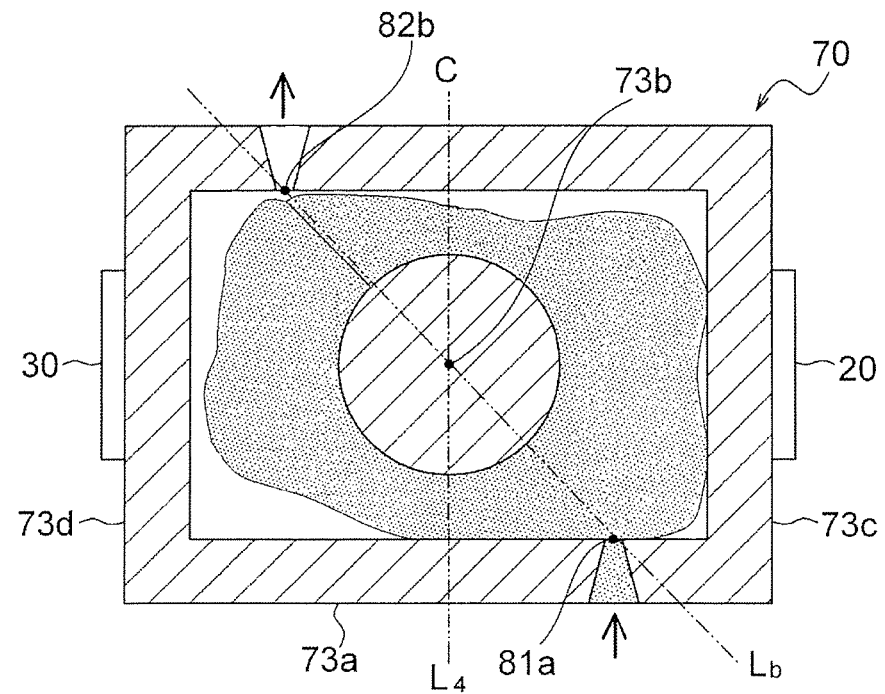
FIG. 6b is a plan sectional view of an upper mold according to an embodiment of the present invention, showing FIG. 5(c) in a direction of arrow line B-B.

In the upper mold 70, as shown in FIG. 6a, FIG. 6b etc., the inlet port 81 is provided in the first wall surface 73a and the outlet port 82 is provided in the second wall surface 73 which is opposite surface to the first wall surface. FIG. 6a and FIG. 6b are views of an upper mold described above, each showing a plan sectional view in a direction of arrow line B-B shown in FIG. 5(c). As shown in FIG. 6a, the inlet port 81 and the outlet porti82 are arranged asymmetrically with respect to the straight line $L_3$. In the present specification, the straight line $L_3$ refers to a straight line passing through the center c of the protruding portion 75 and extending in a direction in parallel with the first wall surface 73a. The positional relationship between the inlet port and the outlet port in the upper mold corresponds to the positional relationship between the first gate mark and the second gate mark in the light emitting device.

Also, the inlet port 81 and the outlet port 82 are arranged so that the straight line $L_A$ and the straight line $L_b$ cross in the upper mold 70 (preferably in the protruding portion 74, more preferably at the center c) of the protruding portion. In the present specification, the straight line L4 refers to a straight line passing through the center c of the protruding portion 75 and extending in a direction in parallel with the first wall surface 73a. The straight line $L_b$ refers to a straight line passing through the center 81a of the inlet port and the center 82b of the outlet port.

As shown in FIG. 4b, the center 81a of the inlet port is provided closer to the first cut-off portion 74a than to the second cut-off portion 74b and the center 82b of the outlet port is provided closer to the second cut-off portion 74b than to the first cut-off portion 74b. As shown in FIG. 6a and FIG. 6b, arranging the inlet port 81 and the outlet port 82 as described above allows flowing of the resin injected from the inlet port evenly in the mold and efficient release of the gas generated inside the mold to outside. Accordingly, a resin package free from voids and having high strength can be obtained.

Generally, a resin injected from the inlet port 81 collides to a protruding portion of the mold and once diverges. The diverged flows of the resin respectively flow along the circumference of the protruding portion and meet and mix together with the resin flowed from various directions. With this, a linear mark occurs at the meeting portion, that is, near the outlet port, and a weld line is formed. The weld line occurs due to various kinds of external factors such as fluidity of the resin, variations in viscosity of the resin, and difference in injection times. The weld line may be pushed outside from the outlet port and not to be formed (or hardly formed). Also, generally, stress occurs due to the expansion and contraction of the sealing member disposed in a recessed portion of the resin package in this step, and the region a (see FIG. 2a) which has the smallest thickness as described above is the portion where such stress concentrates. Thus, avoiding a formation of the weld line in the region a enables of enhancing the strength of the resin package. The resin package of the light emitting device according to the present invention has the inlet port 81 and the outlet port 82 arranged as described above, that is, the inlet port and the outlet port are arranged in view of the flow of the resin in the mold so as not to form the weld line in the region a. Accordingly, the weld line is formed at a location away from the region "a" having the smallest thickness in the resin package, or pushed outside from the outlet port and no weld lines are formed, and thus, strength of the resin package is secured.

Figure 4C:
FIGS. 4c(a) to 4c(e) are plan views each showing an inlet port (outlet port) of a mold for use in manufacturing a resin molded body which is used for manufacturing a light emitting device according to Embodiment 1 of the present invention.
Figure 4C:
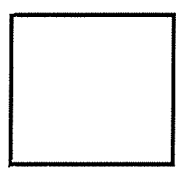
Figure 4C:
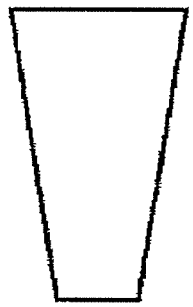
Figure 4C:
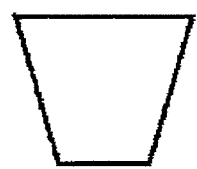
Figure 4C:
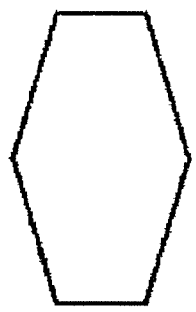

The inlet port 81 is the gate for injecting a resin and the outlet port 82 is the gate for releasing the resin, and respectively formed penetrating the wall of the mold. The shapes of the inlet port 81 and the outlet port 82 are not specifically limited and have a cross section of a polygonal shape such as a rectangle, a circular shape, a semicircular shape, or a semi-oval shape. The planar shape may be formed, as shown in FIG. 4c, with a rectangular shape (a) or a square shape (b), a trapezoidal shape (c), (d), a hexagonal shape (e), or the like. The inlet port and the outlet port may be formed with the same width in the thickness direction of the wall. It is preferable that the inlet port is formed with the width decreasing from the entrance portion to the exit portion and the outlet port is formed with the width increasing from the exit portion to the entrance portion. Two or more each of the inlet port and the outlet port may be provided in the wall of the mold. Such inlet ports or outlet ports may be arranged side by side in a row in the same outer wall surface or arranged one above the other in a row in the same outer wall surface.

The wall surface 73 includes the first wall surface 73a, the second wall surface 73b, the third wall surface 73c, and the fourth wall surface 73d, which are respectively form the first outer wall surface 11a, the second outer side surface 11b, the third outer wall surface 11c, and the fourth outer wall surface 11d of the resin package 10. That is, the wall surface 73 is a portion for forming the outer shape of the resin package 10, and in FIG. 4b, it is formed in a rectangular shape in plan view. The shape of the outer wall portion may be appropriately formed according to a desired shape of the resin molded body.

In the mold shown in FIG. 4a, the first cut-off portion 74a is a portion to which the first lead frame 20 is to be tightly attached, and which is provided by cutting off a part of the bottom surface of the third outer wall portion 73c. The height h of the second cut-off portion 74b is arranged to be approximately the same as the thickness of the second lead frame 20. The second cut-off portion 74b is a portion to which the second lead frame 30 is to be tightly in contact with, and provided by cutting off a part of the bottom surface of the fourth outer wall portion. The height h of the second cut-off portion 74b is arranged to be approximately the same as the thickness of the second lead frame 30. Further, in a case where three or more lead frames are disposed, the cut-off portion can be appropriately provided according to the shape and the configuration of the lead frames.

The protruding portions 75 are provided at the center portion of the main body 72 in order to define the recessed portion 105 in each resin package. The protruding portion 75 has a truncated cone shape tapering from the main body downward. Accordingly, the shape of the recessed portion provided in the resin package 10 is tapered toward the bottom surface 10c. The bottom surface of the protruding portion 75 is formed flat in order to be in contact with the first lead frame and the second lead frame. This arrangement is employed so that in the step of trans-molding, the thermosetting resin can be prevented from flow into the contacting portion, thus an exposed portion where a part of each of the lead frames is exposed from the resin molded body. The protruding portion 75 is appropriately formed according to the shape of the recessed portion defined in the resin package 10.

The groove portion 76 is a space defined by the main body portion 72, the outer wall portion 73, and the protruding portion 75, and creates a space 79 when the upper mold 70 and the lower mold 71 are closed. The lower mold 71 is a plate-like member with a predetermined thickness. The shape of the lower mold is not specifically limited, but the surface which is to mate with the upper mold is preferably formed flat (FIG. 5).

Although not specifically shown in the figure, in the upper portion of the upper mold 61, a pin insertion hole is provided through the main body. The pin insertion hole is a hole for inserting a pin to remove the resin molded body 24 from the upper mold 61. The shape of the upper mold 70 and the lower mold 71 are not limited to that described above and may be changed appropriately. The method of manufacturing a light emitting device described above also enables manufacturing of a number of light emitting devices in a short time and thus a significant improvement in the productivity can be achieved.

The mold is provided with a plurality of mold cavities to form a resin molded body to simultaneously form a plurality of resin packages for light emitting devices. For example, as shown in FIG. 4a, the inlet port 83 provided for the second (for example, n+1) mold cavity a2 is preferably connected to the outlet port provided for the first (for example, n) mold cavity a1. The outlet port 84 provided for the second mold cavity a2 is preferably connected to the inlet port of the third (for example, n+2) mold cavity a3 to which the resin is thereafter injected. As described above, linearly arranging a plurality of mold cavities (for example, "n" mold cavities) in the resin injection direction enables the production of large numbers of resin molded bodies at once. Also, the inlet ports (or outlet ports) provided in each of the mold cavities may be arranged in a zig-zag manner and the resin is injected. In other words, in order to use the inlet port provided for each of the mold cavities also as the outlet port provided for respective adjacent mold cavity, the mold cavities may be alternately arranged in the opposite position or in a mirror-image style so that a plural sets of an inlet port, a space, and an outlet port in this order are continuously arranged, and the resin is injected. Forming the resin molded body as described above, inclusion of voids in the resin molded body can be prevented so that a resin package can be formed with a weld line which is a joining region of the resin in the mold being spaced apart from the above-described region "a". With the arrangement in the mold provided with the inlet ports and outlet ports as described above, a number of light emitting devices can be manufactured in a short time and thus a significant improvement in the productivity can be achieved. In this embodiment, the expression "using an inlet port also as an outlet port" refers that the both ports physically overlap and serve both functions. The expression "reversely arranging the mold cavities" refers to an arrangement of turning the mold cavity 180°, and the expression "arranging the mold cavity in a mirror-image style" refers to an arrangement of switching the left end and the right end of the mold cavity. That is, a plurality of mold cavities for resin molding are arranged in a mold having the inlet ports and outlets ports described above arranged asymmetrical with respect to the straight line $L_3$, thus enables obtaining of a great numbers of resin molded bodies at once. Arranging a plurality of mold cavities enables continuous formation of resin packages and also reduction of the amount of runners to be discarded, so that light emitting devices can be provided at a low price.

Figure 14:
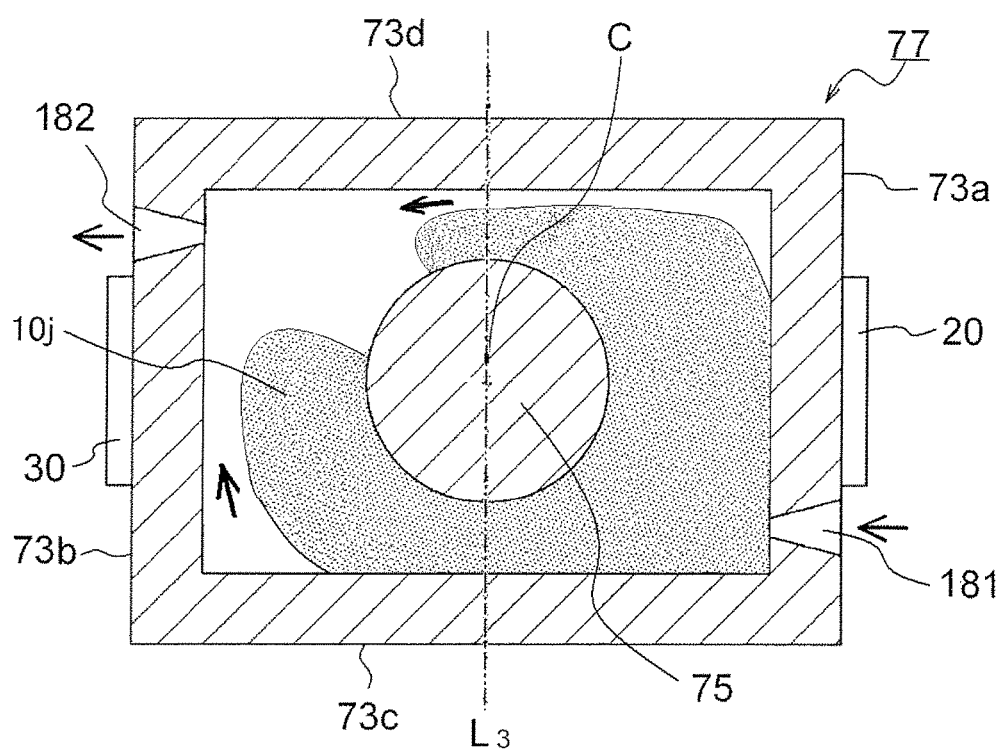
FIG. 14 is a plan sectional view showing an upper mold for manufacturing a resin molded body which is used in the manufacturing the light emitting device shown in FIG. 9.

When forming the light emitting device 90 shown in FIG. 9, as the upper mold 77 shown in FIG. 14, that is, the wall surfaces from which the leads 20, 30 are respectively extended may be the first wall surface 73a and the second wall surface 73b which are at the opposite sides. That is, it may be such that the inlet port 181 is faulted in the first wall 73a from which the first lead frame 20 is extended and the outlet port 182 is formed in the second wall 73b from which the second lead frame is extended. The same positional relationship as described above can be applied to the corresponding portions while the wall surfaces adjacent to the first wall surface 73a and the second wall surface 73d are respectively designated as the third wall surface 73c and the fourth wall surface 73d.

Embodiment 2

Figure 15:
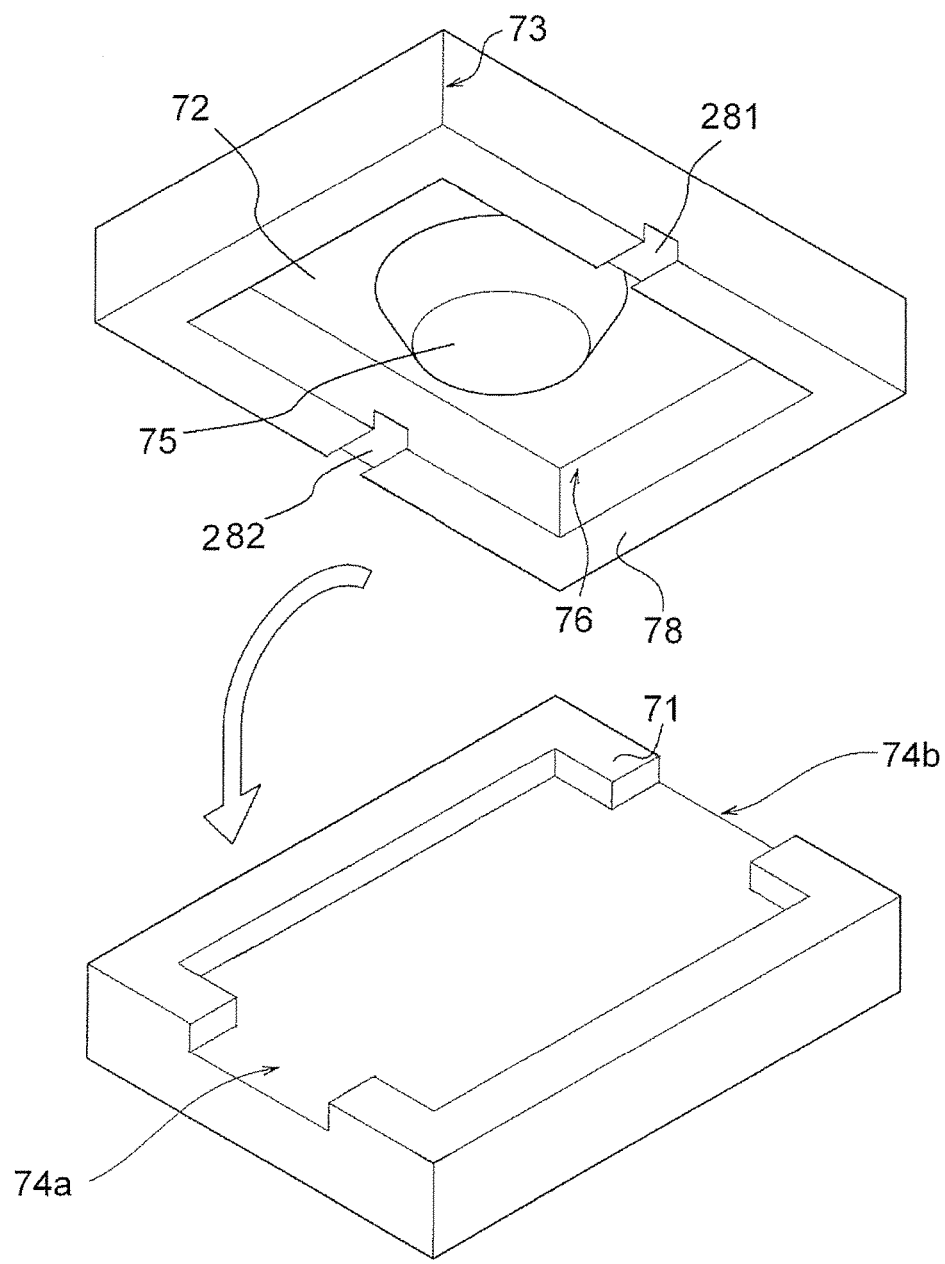
FIG. 15 is a perspective view showing an upper mold for manufacturing a resin molded body which is used in the manufacturing the light emitting device shown in FIG. 10.
Figure 16:
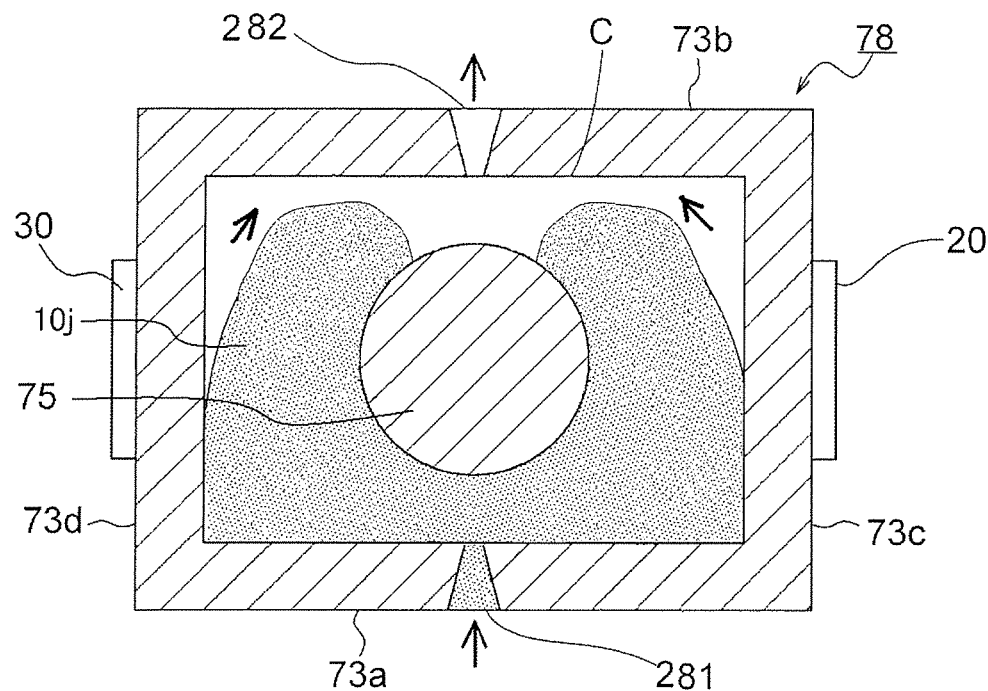
FIG. 16 is a plan sectional view showing an upper mold for manufacturing a resin molded body which is used in the manufacturing the light emitting device shown in FIG. 10.

In this embodiment, the upper and lower molds 78, 71 shown in FIG. 15 are used for manufacturing the light emitting device 91 shown in FIG. 10 and FIG. 11. That is, the wall defining the inlet port 281 and the wall defining the outlet port 282 are facing each other and the inlet port 81 and the outlet port 82 are symmetrically arranged with respect to the straight line $L_3$. Also, the inlet port 81 and the outlet port 82 are arranged on the straight line $L_4$. Accordingly, as shown in FIG. 16, the resin 10j moves smoothly around the protruding portion 75 which enables reduction of time required for bonding, so that the speed of curing reaction of the resin can be increased and the manufacturing speed of resin molded bodies can be synergistically increased.

Embodiment 3

Figure 17:
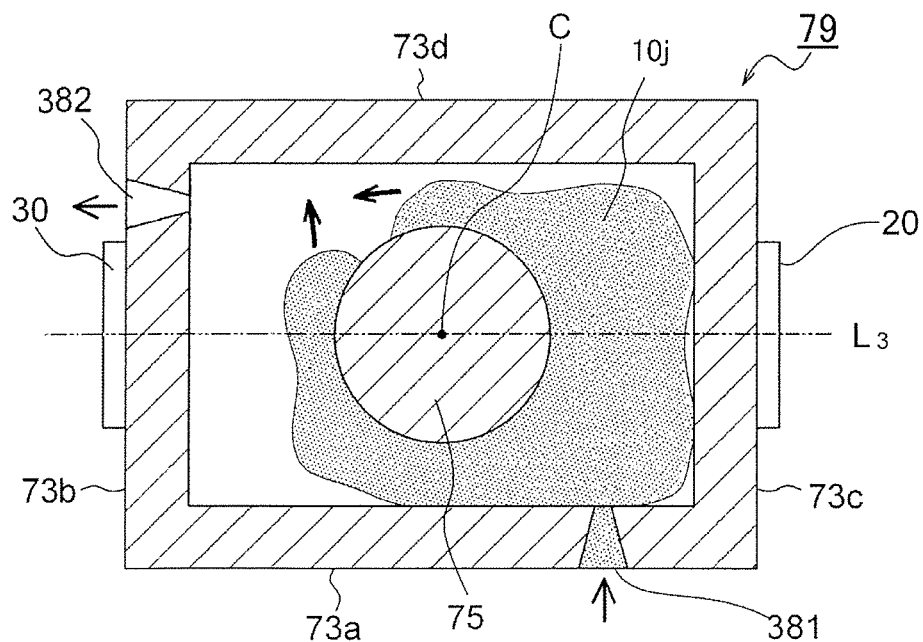
FIG. 17 is a plan sectional view showing an upper mold for manufacturing a resin molded body which is used in the manufacturing the light emitting device shown in FIG. 12.
Figure 18:
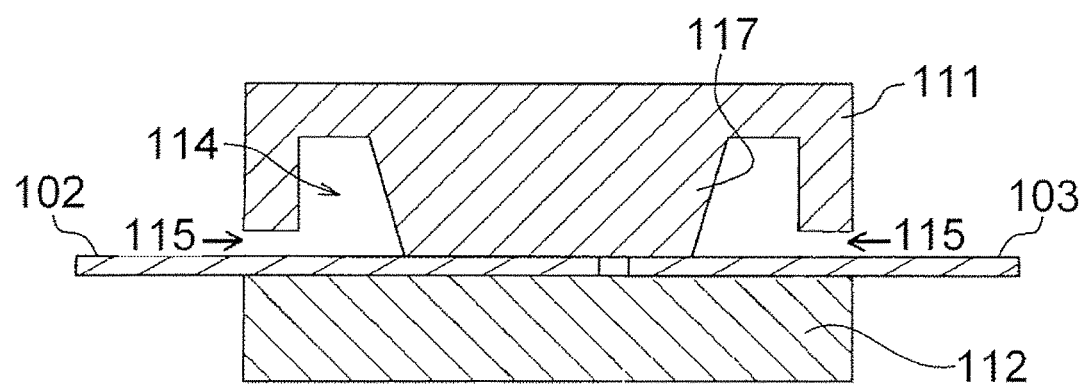
FIG. 18 is a cross-sectional view of a mold according to a conventional method.

In this embodiment, the upper mold 79 shown in FIG. 17 is used for manufacturing the light emitting device 92 shown in FIG. 12 and FIG. 13. That is, the second wall surface 73b defining the outlet port 382 is arranged adjacent to the first wall surface 73a defining the inlet port 381. Also, the outlet port 382 is arranged at the opposite side of the inlet port 381 with respect to both the straight line $L_3$ and the straight line $L_4$.

Figure 5A:
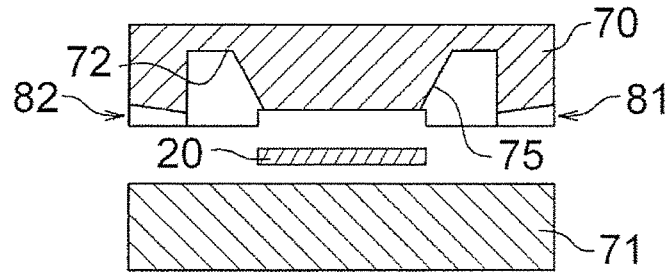
FIGS. 5(a) to 5(e) are cross-sectional views showing a method of manufacturing a light emitting device according to the first embodiment of the present invention.

Now, a method of manufacturing the light emitting device according to the present invention common to all the preferred embodiments described above will be described below. After preparing the upper and lower molds 70, 71, as shown in FIG. 5(a), the first lead frame 20 and the second lead frame 30 (not shown) are arranged between the upper mold 70 and the lower mold 71. Metal-plated lead frames are used for the lead frames. The first lead frame 20 and the second lead frame 30 are arranged spaced apart from each other at an interval 10e (FIG. 3) to prevent short circuit.

Figure 5B:
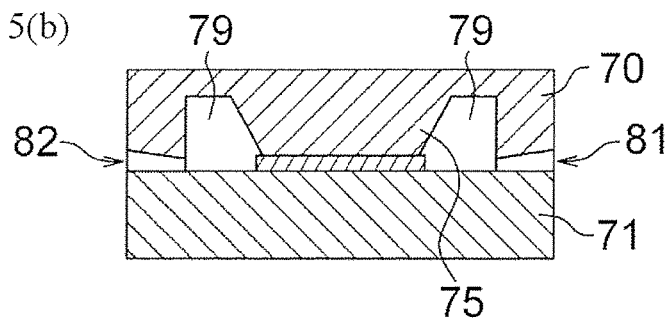

Next, as shown in FIG. 5(b), the first lead frame 20 and the second lead frame 30 are held with the upper mold 70 and the lower mold 71. That is, a part of the first lead frame 20 corresponding to the first inner lead portion 20a (FIG. 2) and a part of the second lead frame 30 corresponding to the second inner lead portion 30a are in contact with the bottom surface of the protruding portion 75. At this time, the space 79 is defined in the mold by mating the upper mold 70 and the lower mold 71, and the other end part of each of the first lead frame 20 and the second lead frame 30 are exposed outside of the upper mold 70 and the lower mold 71. The upper mold 70 and the lower mold 71 are preferably held together without any interspace, but they may be held with some interspace according to the kinds or viscosity of the resin employed.

Next, as shown in FIG. 5(c), a resin is injected from the inlet port 81 into the space 79 defined by the upper mold 70 and the lower mold 71, under a predetermined temperature and pressure by way of transfer molding. The resin 10j injected from the inlet port 81 flows toward the protruding portion 75, as shown in FIG. 6a, and flows into the space 79 defined at the both sides of the protruding portion. The resin that has flown in and filled the space is then divided approximately evenly in two at the protruding portion. Thereafter, the flows of the resin 10j join near the outlet port 82 which is at the opposite side from the inlet port with respect to the center c of the protruding portion 75, and a weld line is formed at the joining interface. Thereafter, the resin 10j is released from the outlet port 10j. Thus, the resin molded body is formed on the lead frame. The resin discharged from the outlet port 82 is then injected in a mold for molding another resin package. The gates 83 are formed at the positions corresponding to the inlet port and the outlet port, and respective gate mark are formed by cutting off the gates 83. The first lead frame 20 and the second lead frame 30 are respectively held by the upper mold 70 and the lower mold 71, so that the first lead frame 20 and the second lead frame 30 do not flutter while injecting the thermosetting resin, and generation of burr can be prevented. Even in a case where gas is included in the resin flowing in the mold, the gas can be discharged from the outlet port 82. Therefore, voids can be prevented from remaining in the resin molded body (the resin package, in later time). As described above, when the upper mold 70 and the lower mold 71 are held with some interspace therebetween, the resin enters in the interspace between the upper and lower molds which may cause occurrence of burrs afterwards. However, according to the present invention, when injecting the resin, any remaining air or gas can be expelled easily and totally from the interspace, so that it is advantageous in such manner that the resin can be provided thoroughly in the mold cavity and occurrence of voids in the resin package can be prevented more securely.

Then, the upper mold 70 and the lower mold 71 are heated for a predetermined period of time to harden the thermosetting resin. Next, the upper mold 70 is detached. Accordingly, the package including the resin package 10, the first lead frame 20, and the third lead frame 30 is completed.

Then, the gate 83 formed at the inlet port 81 portion, as shown in FIG. 5(*d*), is cut or trimmed along the first outer side surface 11*a* by using a known cutting machine or trimming machine. Then, the gate 83 formed at the outlet port 82 portion is cut or trimmed along the second outer side surface 11*b*. Accordingly, the first gate mark 5*a* and the second gate mark 5*b* are formed as the cut traces of the gates. Optionally, before or after the step described above or at the time of cutting the gates, burr trimming is carried out in which burrs are cut off, for example, by using a cutting mold. Particularly, when the upper mold 70 and the lower mold 71 are held with a slight interval therebetween as described above, it is preferable to carry out burr trimming. Also, it is preferable to carry out main curing of once cured resin to complete the hardening.

Thereafter, as shown in FIG. 5(*e*), the light emitting element 2 is mounted on the upper surface of the first lead frame 20 in the recessed portion of the resin package, and the light emitting element 2 and the first lead frame 20, and the light emitting element 2 and the second lead frame 30, are respectively electrically connected. The connection between the lead frames and the light emitting element may be respectively established by a wire, but may also be established by mounting the light emitting element on a lead frame in a face-down manner. The step of mounting the light emitting element may be performed after removing the resin package from the mold.

Thus, the recessed portion is covered with the sealing member. An instillation method can be used for applying the sealing member. The instillation method allows the remaining air in the recessed portion to be discharged more efficiently. The thermosetting resin preferably contains a fluorescent material. This enables to facilitate the color control of the light emitting device. An injection technique or an extrusion technique may be used for disposing the sealing member. In a case where a thermosetting resin is used for the sealing member, heat is applied after disposing the resin to harden the resin to obtain the molding.

Next, the resin package and the lead frame are cut to be separated. The cutting is carried out from the resin package side by using a cutting mold. The lead which is cut off from the lead frame includes an inner lead which is placed in the resin package and an outer lead which is exposed from the resin package. The cutting may be carried out by using a dicing saw. According to the method described above, the light emitting device 1 can be formed.

As described above, in the light emitting device according to the present invention, the first gate mark and the second gate mark formed in the resin package are arranged at specific locations, providing a relationship between the weld line and the thinnest region of the resin package which enables obtaining of the resin package having a high degree of strength, so that occurrence of cracks can be prevented. Also, gases are prevented from accumulating in the resin molded body and efficiently released from the outlet port, so that a resin package having a high degree of strength can be obtained. Further, inclusion of a 1,3,5-triazine derivative epoxy resin which is a thermosetting resin in the resin package allows a faster hardening reaction and molding of a resin molded body of enhanced strength. Also, arranging the gate marks symmetrically at the opposite sites allows reduction of time required for joining the separate flows of the resin, even in the case where the hardening reaction rate of the injecting resin is increased. Thus, the manufacturing speed of resin molded bodies can be synergistically increased.

While a light emitting device and a method of manufacturing the light emitting device according to the present invention have been described above, it should be understood that the present invention is not limited thereto. The same is applied to the examples of the present invention shown below, and some of the components described in the embodiments may be omitted.

Example 1

The light emitting device 1 shown in FIGS. 1*a* and 1*b*, FIGS. 2*a* to 2*c*, and FIG. 3 includes a light emitting element 2, a resin package 10, and a package integrally formed with a first lead 20 and a second lead 30. The first lead 20 and the second lead 30 have a planar shape with a plating applied thereon. The thickness of those is 0.5 mm. The light emitting element is a LED made of a nitride semiconductor having an emission peak wavelength at 450 nm and capable of emitting blue light.

The resin package has an approximately rectangular parallelepiped shape provided with a recessed portion 105 opening into a mortar shape. The size of the resin package is 5 mm long, 5 mm wide, and 1.4 mm high, the upper opening of the recessed portion is approximately 4 mm in diameter, the bottom surface 10*c* in the recessed portion is approximately 3.5 mm in diameter, and the depth of the recessed portion is 0.9 mm.

The resin package is formed from an epoxy resin which is a thermosetting resin. The epoxy resin contains titanic oxide as a light reflective member at about 30% by weight. After hardening, the resin package has a light reflectance of 85% at 450 nm wavelength.

The outer side surface 11 of the resin package 10 is made of four surfaces: a first outer side surface 11*a* on which the first gate mark 5*a* to be arranged, a second outer side surface 11*b* on which the second gate mark 5*b* to be arranged, a third outer side surface 11*c* on which the first outer lead 20*b* to be extended, and a fourth outer side surface 11*d* on which the second outer lead 30*b* to be extended. The first outer side surface 11*a* and the second outer side surface 11*b* are at the opposite sides and the third outer side surface 11*c* and the fourth outer side surface 11*d* are at the opposite sides. The first gate mark is arranged in the first outer side surface at 750 µm from the edge of the first outer lead side. The width of the first gate mark is 1000 µm and the height of the first gate mark is 300 µm. Further, the second gate mark is arranged in the second outer side surface at 750 µm from the edge of the second outer lead side. The width of the second gate mark is 1000 µm and the height of the second gate mark is 300 μm. That is, the first gate mark 5a and the second gate mark 5b are arranged asymmetrically with respect to the straight line ($L_1$; see FIG. 2b) passing through the center of the recessed portion 105 to be described later and extending in parallel direction with the first outer side surface 11a. The first gate mark 5a and the second gate mark 5b are arranged so that in the recessed portion 105 to be described later, the straight line ($L_2$; see FIG. 2c) passing through the center of the recessed portion 105 to be described later and extending in a direction perpendicular to the first outer side surface 11a and the straight line ($L_a$) connecting the center of the first gate mark 5a and the center of the second gate mark 5b intersect in the recessed portion 105. Further, the center of the first gate mark 5a and the center of the second gate mark 5b are not on the straight line ($L_2$).

The light emitting element is mounted on the first inner lead 20a and is respectively electrically connected to the first lead and the second lead by a wire W. The recessed portion 105 of the resin package is filled with the sealing member made of a silicone resin which encloses the light emitting element and the like. The sealing resin contains a $(Y, Ga)_3(Al, Ga)_5O_{12}$:Ce as a fluorescent material capable of emitting yellow light.

The light emitting device can be manufactured as described below. First, a mold shown in FIG. 4a is prepared. In the present example, a mold made of an upper mold 70 and a lower mold 71 which engage with each other is used. In the upper mold 70, an inlet port 81 reaching the first wall surface corresponding to the first outer side surface of the resin package 10 is provided in the first outer side surface 73a, and an outlet port 82 reaching the second wall surface corresponding to the second outer side surface of the resin package 10 is provided in the second outer side surface 73b. In the upper mold, a first cut-off portion 74a reaching the third wall surface corresponding to the third outer side surface of the resin package 10 is provided in the third outer side surface 73c for interposing the lead frame therein is provided in the third outer side surface 73c, and a second cut-off portion 74b is provided in the fourth outer side surface. In the fourth outer side surface is provided with the fourth cut-off portion 74b reaching the fourth wall surface corresponding to the fourth outer side surface of the resin package. The upper mold is provided with three mold cavities to respectively mold a resin molded body, and a protruding portion 75 is formed at the center portion of each mold cavity. FIG. 4a discloses three mold cavities, but the number of the mold cavities is not limited thereto, three or more mold cavities may be provided. The size of the inlet port and the outlet port provided in the upper mold is approximately the same as the gate marks formed on the light emitting device.

A lead frame of predetermined size is placed in the first cut-off portion and the second cut-off portion of the upper mold 70, and the lower surface of the upper mold is engaged to the upper surface of the lower mold 71, so that the lead frame is held by the upper and lower molds.

The epoxy resin described above is provided by way of transfer molding in the space defined between the upper mold and the lower mold to form a resin molded body on the lead frame. After heat and pressure are applied to melt the epoxy resin of pellet shape, the epoxy resin is injected from the inlet port 81 of the first outer wall 73a. The injected resin flows in the space of the first mold cavity in the mold. The flow of the resin is divided to both sides of the protruding portion 75 and fill the space 76. Thereafter, the flows are joined and discharged from the outlet port 83 of the first mold cavity. The resin is then injected in the second mold cavity from the inlet port of the second mold cavity which is also the outlet port of the first mold cavity, and flows in the space in the second mold cavity and is divided to the both sides of the protruding portion 75 and fill the space 76. Thereafter, the flows are joined and discharged from the outlet port 84 of the second mold cavity. In the same manner, the flows of the resin which filled the space of the third mold cavity are joined near the outlet port 82 of the second outer wall 73b, and finally discharged outside from the outlet port. At this time, the gas generated in the mold is pushed out from the outlet port 82, so that voids will hardly occur in the joining portion of the resin which is molded in each cavity. The joining portion of the resin is formed spaced apart from the thinnest portion (that is, the region "a") of the side surfaces constituting the resin package, so that a resin package with high degree of strength can be obtained.

Next, the filled epoxy resin is temporarily hardened and then the upper mold is removed. Following that, the gates formed at the inlet port and the outlet port of the resin molded body are cut to form the first gate mark and the second gate mark on the outer side surfaces of the resin package. Before or after the step described above, using a cutting mold, burr trimming is carried out on each of the outer side surfaces which will be the four sides of the resin package. The first and second gate marks may be formed along with the burr trimming. Thereafter, heat is further applied to complete the hardening. Heat may be applied to complete the hardening before trimming the burrs. The leads are cut off from the lead frame to obtain the resin molded body in which the lead frame and the epoxy resin are integrally molded.

Next, using a die-bonding member, a light emitting element 2 is mounted on the first inner lead 20a at the bottom surface portion 10c in the recessed portion of the resin package 10. Thereafter, the light emitting element 2 is electrically connected to the first lead and the second lead by using a wire respectively. Next, the above-described sealing member 40 containing a fluorescent material is filled in the recessed portion. Manufacturing the light emitting elements as described above, a number of light emitting devices with high degree of strength can be manufactured.

Example 2

Figure 7A:
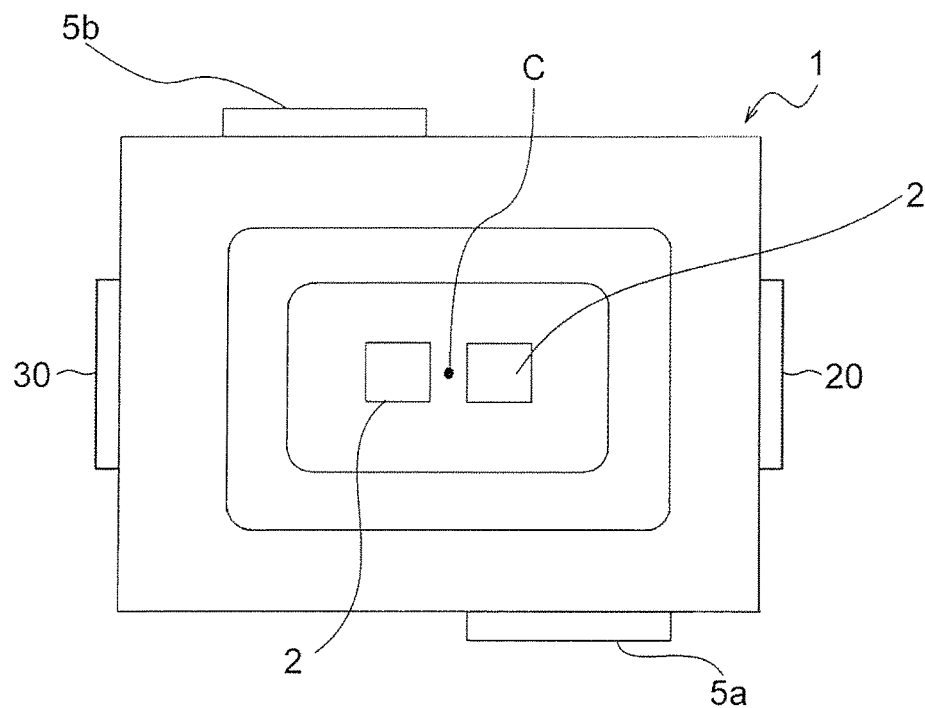
FIG. 7a is a plan view showing a light emitting device according to another embodiment of the present invention.
Figure 7B:
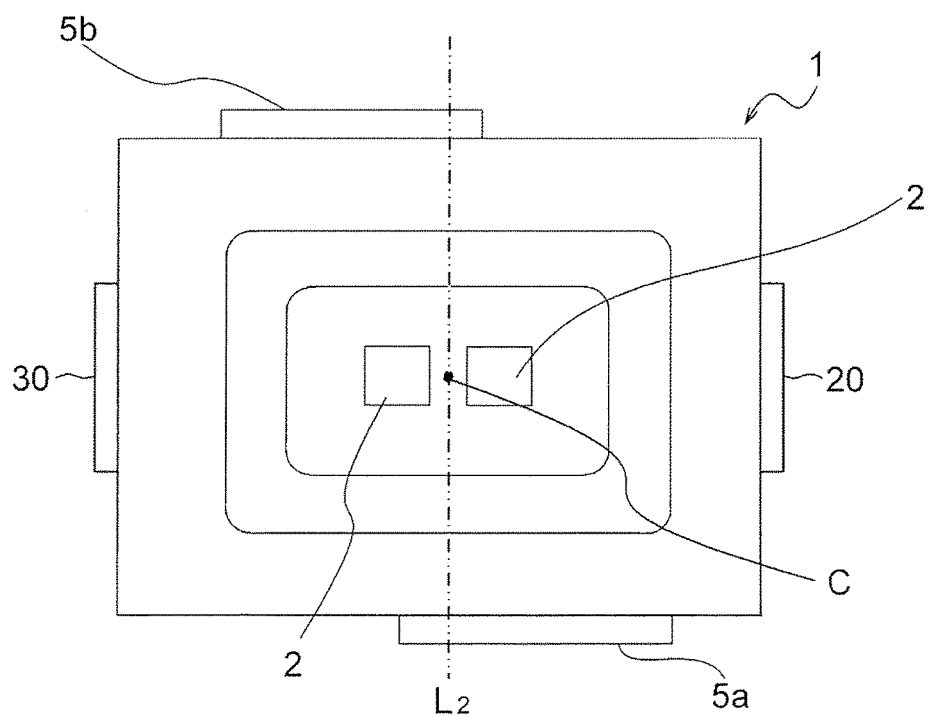
FIG. 7b is a plan view showing a light emitting device according to yet another embodiment of the present invention.

As shown in FIG. 7a, the light emitting device according to Embodiment 2 has substantially the same configuration as in Example 1 except that two LEDs are mounted as the light emitting elements 2, the recessed portion 105 of resin package is defined in a rectangular shape, and the first gate mark 5a and the second gate mark 5b are formed with a large width of about 2 mm. Inner leads and wires are not shown in FIG. 7. As described above, increasing the width of the first and second gate marks 5a, 5b allows manufacturing of the resin packages without including the voids, even in the case where the width of the resin package is increased. As described above, with an increase in the number of the light emitting elements mounted on the device, the brightness of the light emitting device can be improved. As shown in FIG. 7a, the light emitting device according to Embodiment 2 has substantially the same configuration as in Example 1 and can be manufactured in the same manner, except that the first gate mark 5a and the second gate mark 5b are formed with a wider width of about 2.5 mm. Such a light emitting device is also capable of exerting the same effect as described above and of accommodating a much larger width of the resin package, and the larger widths of the inlet port and outlet port allows the injection and release of the resin in a much shorter time.

Example 3

Figure 8:
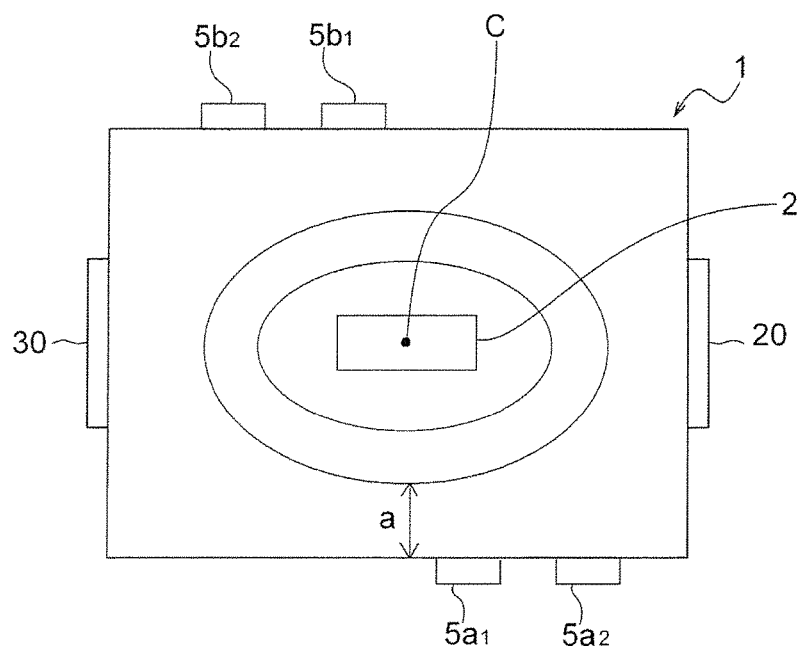
FIG. 8 is a plan view showing a light emitting device according to another embodiment of the present invention.

As shown in FIG. 8, the light emitting device according to Example 3 has substantially the same configuration and can be manufactured in the same manner as in Example 1, except that the first gate marks (each width: 0.5 mm) formed on the first outer side surface of the resin package two in number, one is the gate mark $5a_1$ and the other is the gate mark $5a_2$, and the second gate marks (each width: 0.5 mm) formed on the second outer side surface of the resin package two in number, one is the gate mark $5b_1$ and the other is the gate mark $5b_2$, and the recessed portion 105 of the resin package is defined in an elliptical shape. Inner leads and wires are not shown in FIG. 8. For the mold used in the manufacturing the light emitting device of Example 3, a mold having two inlet ports and two outlet ports is employed. With multiple inlet ports and outlet ports as described above, the resin can be filled in the mold in a short time. In the light emitting device of the present embodiment, the center portion of both the first gate marks $5a_1$, $5a_2$ is at the first lead 20 side and the center portion of both the second gate marks $5a_1$, $5a_2$ is at the second lead 30 side. Accordingly, when the resin is injected from the inlet ports corresponding to those gate marks, the region where the divided flow of the resin to the both sides of the protruding portion rejoin is formed spaced apart from the thinnest portion (that is, the region "a") of the side surfaces constituting the resin package. As a result, a resin package having a high degree of strength can be obtained.

Example 4

The light emitting device 90 according to Example 4 has, as shown in FIG. 9, the end portion of the first gate mark 95a at the second lead 30 side is formed at the second lead 30 side beyond the straight line $L_2$. Further, the light emitting device 90 has a substantially the same configuration as in Example 2, except that the end portion of the second gate mark 95b at the first lead 20 side is formed at the first lead 20 side beyond the straight line $L_2$. In such a light emitting device, the center point (occurrence point of weld line) of each gate mark is spaced apart from the region "a" so that the resin package of high strength can be obtained. Using the upper mold 77 shown in FIG. 14, the light emitting device 90 can be manufactured substantially in the same manner as in Example 1. The light emitting device with a resin package having high degree of strength can also be obtained in this example.

Example 5

As shown in FIG. 10 and FIG. 11, in a light emitting device 91 according to Example 5, the first gate mark 96a is formed on the first outer side surface 11a, and the second gate mark 96b is formed on the second outer side surface 11b which is the opposite side of the first outer side surface 11a. The configuration is substantially the same as in Example 2, except that the first gate mark 96a and the second gate mark 96b are arranged symmetrically with respect to the straight line $L_1$ so that the first gate mark 96a and the second gate mark 96b are on the straight line $L_2$. The light emitting device 91 can be manufactured substantially in the same manner as in Example 1, except that the upper and lower molds 78, 71 shown in FIG. 15 are used and the flow of the resin 10j is controlled as shown in FIG. 16. The light emitting device with a resin package having high degree of strength can also be obtained in this example.

Example 6

The light emitting device 92 according to Example 6 has, as shown in FIG. 12 and FIG. 13, a substantially the same configuration as in Example 2, except that the resin package has the first outer side surface 98a and the second outer side surface 98b which is adjacent to the first outer side surface, the first gate mark 97a is formed on the first outer side surface 98a and the second gate mark 97b is formed on the second outer side surface 98b, the second gate mark 97b is arranged at the opposite side of the first gate mark 97a with respect to the straight line $L_1$ and is also arranged at the opposite side of the first gate mark 97a with respect to the straight line $L_2$. The light emitting device 92 can be manufactured substantially in the same manner as in Example 1, except that the upper mold 79 shown in FIG. 17 is used and the flow of the resin 10j is controlled as shown by arrows in FIG. 17. The light emitting device with a resin package having high degree of strength can also be obtained in this example.

The present invention can be applied to lighting equipments, displays, backlight for mobile terminal devices (cellular phones etc.), backlight for TVs, auxiliary light source for moving images, and other general consumer light sources.

DENOTATION OF REFERENCE NUMERALS

1, 90, 91, 92; light emitting device: 2; light emitting element: 5a, 5b, 95a, 95b, 96a, 96b; gate mark: 10; resin package: 10b; side surface portion: 10c; bottom surface portion: 10e; intermittent portion: 10j; resin: 11; outer side surface: 11a, 91a, 98a; first outer side surface: 11b, 91b, 98b; second outer side surface: 91c, 98c; third outer side surface: 91d, 98d; fourth outer side surface: 20; first lead, first lead frame: 30; second lead, second lead frame: 70, 77, 78, 79; upper mold: 71; lower mold: 72; main body: 73; wall surface: 73a; first wall surface: 73b; second wall surface: 73C; second wall surface: 73d; second wall surface: 74a; first cut-off portion: 74b; second cut-off portion: 75; protruding portion: 76; groove portion: 79; space: 81, 83, 181, 281, 381; inlet port: 82, 84, 182, 282, 382; outlet port: 105; recessed portion.

The invention claimed is:
1. A light emitting device comprising:
   a light emitting element;
   a resin package defining a recessed portion serving as a mounting region of the light emitting element, the resin package being formed of a resin package material;
   a gate mark formed on an outer side surface of the resin package, the gate mark being one of a projection projecting out from the outer side surface or a recess depressed inwardly from the outer side surface;
   a lead arranged on a bottom surface of the recessed portion and electrically connected with the light emitting element, the light emitting element being mounted on the lead; and
   a sealing member disposed in the recessed portion of the resin package and covering the light emitting element,
   wherein the gate mark includes a first gate mark that is made only of the resin package material and is formed on a first outer side surface of the resin package, and a second gate mark that is made only of the resin package material and is formed on an outer side surface of the resin package which is a different outer side surface than the first outer side surface, the first gate mark and the second gate mark being disposed at positions spaced apart from an upper edge of the resin package.

2. The light emitting device according to claim 1, wherein the outer side surface provided with the second gate mark is arranged opposite side of the first outer side surface.

3. The light emitting device according to claim 1, wherein the first gate mark is arranged symmetrically with the second gate mark with respect to a straight line ($L_1$) passing through a center of the recessed portion and extending in a direction in parallel to the first outer side surface.

4. The light emitting device according to claim 1, wherein at least one of the first gate mark and the second gate mark is arranged on a straight line ($L_2$) passing through the center of the recessed portion and extending in a direction perpendicular to the first outer side surface.

5. The light emitting device according to claim 1, wherein the first gate mark and the second gate mark are arranged asymmetrically with respect to a straight line ($L_1$) passing through a center of the recessed portion and extending in a direction in parallel to the first outer side surface.

6. The light emitting device according to claim 1, wherein the first gate mark and the second gate mark are arranged so that in the recessed portion a straight line ($L_a$) connecting a center of the first gate mark and a center of the second gate mark intersects the straight line ($L_2$) passing through the center of the recessed portion and extending in a direction perpendicular to the first outer side surface.

7. The light emitting device according to claim 5, wherein the center of the first gate mark is not on the straight line ($L_2$).

8. The light emitting device according to claim 5, wherein the center of the second gate mark is not on the straight line ($L_2$).

9. The light emitting device according to claim 1, wherein the second outer side surface provided with the second gate mark is arranged adjacent to the first outer side surface, the second gate mark is arranged on an opposite side of the first gate mark with respect to a line ($L_1$) passing through the center of the recessed portion and extending in a direction in parallel to the first outer side surface, and the second gate mark is also arranged on an opposite side of the first gate mark with respect to a line ($L_2$) passing through the center of the recessed portion and extending in a direction perpendicular to the first outer side surface.

10. The light emitting device according to claim 3, wherein when the light emitting device is viewed from a side of the first outer side surface, the second gate mark has a region which does not overlap with the first gate mark.

11. The light emitting device according to claim 1, wherein the first gate mark or the second gate mark is formed by cutting a gate formed on the outer side surface at a time of injecting the resin package material in a designated mold.

12. The light emitting device according to claim 1, wherein at least one of the first gate mark and the second gate mark is formed two or more on a same side surface.

13. The light emitting device according to claim 1, wherein the resin package material includes a thermosetting resin containing a triazine derivative epoxy resin.

14. A method of manufacturing a light emitting device having a resin package having an outer side surface and defining a recessed portion serving as a mounting region of a light emitting element, and a lead arranged at a bottom surface of the recessed portion, the method comprising:
    a step of holding a lead frame with an upper mold and a lower mold paired with the upper mold, the upper mold having a protruding portion fitting in with the recessed portion, an inlet port for injecting a resin package material, which is provided on a first wall surface corresponding to the outer side surface, and an outlet port for discharging the resin package material injected from the inlet port, the outlet port being provided on a wall surface different than the first wall surface;
    a step of injecting the resin package material from the inlet port in a space defined by the upper mold and the lower mold to fill the space with the resin package material;
    a step of discharging the resin package material injected in the space from the outlet port;
    a step of curing the resin package material filled in the cavity to form a resin molded body;
    a step of removing the molds and cutting gates formed on the resin molded body at portions corresponding to the inlet port and the outlet port to form a first gate mark and a second gate mark on different outer side surfaces with the first gate mark and the second gate mark being disposed at positions spaced apart from an upper edge of the resin molded body so as to obtain the resin package formed of the resin package material and obtain the first gate mark and the second gate mark each of which is made only of the resin package material, each of the first gate mark and the second gate mark being one of a projection projecting out from a corresponding one of the outer side surfaces or a recess depressed inwardly from the corresponding one of the outer side surfaces;
    a step of mounting the light emitting element on the lead frame and electrically connecting the light emitting element and the lead frame; and
    a step of disposing a sealing member in the recessed portion after the step of electrically connecting the light emitting element and the lead frame.

15. The method of manufacturing a light emitting device according to claim 14, wherein the wall surface provided with the outlet port is arranged at a location opposite to the first wall surface with the protruding portion interposing therebetween.

16. The method of manufacturing a light emitting device according to claim 14, wherein the inlet port is arranged symmetrically with the outlet port with respect to a straight line ($L_3$) passing through a center of the protruding portion and extending in parallel to the first wall surface.

17. The method of manufacturing a light emitting device according to claim 16, wherein the inlet port and the outlet port are arranged on a straight line ($L_4$) passing through the center of the protruding portion and extending perpendicular to the first wall surface.

18. The method of manufacturing a light emitting device according to claim 14, wherein the inlet port and the outlet port are arranged asymmetrically with respect to a straight line ($L_3$) passing through a center of the protruding portion and extending in parallel to the first wall surface.

19. The method of manufacturing a light emitting device according to claim 14, wherein the inlet port and the outlet port are arranged so that a straight line ($L_4$) passing through a center of the protruding portion and extending perpendicular to the first wall surface and a straight line ($L_b$) passing through a center of the inlet port and a center of the outlet port intersect in the protruding portion.

20. The method of manufacturing a light emitting device according to claim 14, wherein the wall surface provided with the outlet port is arranged adjacent to the first wall surface, the outlet port is arranged on an opposite side from the inlet port with respect to the straight line ($L_3$) passing through the center of the protruding portion and extending in a direction in parallel to the first wall surface, and the outlet port is also arranged on an opposite side from the inlet port with respect to the straight line ($L_4$) passing through the center of the protruding portion and extending in a direction perpendicular to the first wall surface.

21. The method of manufacturing a light emitting device according to claim 14, wherein the molds made of a pair of the upper mold and the lower mold are configured to define a plurality of mold cavities for respectively forming a resin mold body, the outlet port provided to an n-th mold cavity is connected to an (n+1)th mold cavity which is arranged adjacent to the n-th mold cavity, and the (n+1)th mold cavity is also connected to the inlet port provided to an (n+2)th mold cavity which is arranged adjacent to the (n+1)th mold cavity.

22. The method of manufacturing a light emitting device according to claim 14, wherein the plurality of mold cavities are arranged along a direction of injection of the resin package material and the inlet ports and the outlet ports respectively provided to the mold cavities are arranged on a straight line.

23. The method of manufacturing a light emitting device according to claim 14, wherein the plurality of mold cavities are arranged along a direction of injection of the resin package material and the inlet ports and the outlet ports respectively provided to the mold cavities are arranged in a zigzag manner.

24. The method of manufacturing a light emitting device according to claim 14, wherein the plurality of mold cavities are alternately arranged in opposite positions so that an inlet port provided to a cavity also serves as the outlet port provided to an adjacent mold cavity.

25. The method of manufacturing a light emitting device according to claim 14, wherein the lead frame is provided with a hole or a groove.

26. The method of manufacturing a light emitting device according to claim 14, further comprising a step of disposing a sealing member in the recessed portion after the step of electrically connecting the light emitting element and the lead frame.

27. The method of manufacturing a light emitting device according to claim 14, wherein the resin is a thermosetting resin which contains a triazine derivative epoxy resin.

\* \* \* \* \*